(12) United States Patent
Wang et al.

(10) Patent No.: US 10,879,183 B2
(45) Date of Patent: Dec. 29, 2020

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Chuei-Tang Wang, Taichung (TW); Chung-Hao Tsai, Huatan Township (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/272,373

(22) Filed: Feb. 11, 2019

(65) Prior Publication Data
US 2019/0393153 A1    Dec. 26, 2019

Related U.S. Application Data

(60) Provisional application No. 62/688,607, filed on Jun. 22, 2018.

(51) Int. Cl.
| *H01L 23/48* | (2006.01) |
| *H01L 23/538* | (2006.01) |
| *H01L 23/00* | (2006.01) |
| *H01L 23/522* | (2006.01) |
| *H01L 23/528* | (2006.01) |
| *H01L 23/31* | (2006.01) |
| *H01L 21/56* | (2006.01) |

(Continued)

(52) U.S. Cl.
CPC ........ *H01L 23/5386* (2013.01); *H01L 21/563* (2013.01); *H01L 21/565* (2013.01); *H01L 21/76802* (2013.01); *H01L 21/76876* (2013.01); *H01L 21/76898* (2013.01); *H01L 23/3128* (2013.01); *H01L 23/481* (2013.01); *H01L 23/5226* (2013.01); *H01L 23/5283* (2013.01); *H01L 23/5383* (2013.01); *H01L 24/09* (2013.01); *H01L 24/17* (2013.01); *H01L 25/18* (2013.01); *H01L 2224/0231* (2013.01); *H01L 2224/02373* (2013.01); *H01L 2224/02379* (2013.01); *H01L 2924/1205* (2013.01)

(58) Field of Classification Search
CPC ............... H01L 23/481; H01L 23/5226; H01L 23/5386; H01L 21/563; H01L 2924/1205
USPC ....................................................... 257/724
See application file for complete search history.

(56) References Cited

U.S. PATENT DOCUMENTS 7,564,115 B2   7/2009  Chen et al.
7,633,165 B2  12/2009  Hsu et al.
(Continued)

*Primary Examiner* — Nitin Parekh
(74) *Attorney, Agent, or Firm* — Slater Matsil, LLP

(57) ABSTRACT

A device includes a redistribution structure, a semiconductor device on the redistribution structure, a top package over the semiconductor device, the top package including a second semiconductor device, a molding compound interposed between the redistribution structure and the top package, a set of through vias between and electrically connecting the top package to the redistribution structure, and an interconnect structure disposed within the molding compound and electrically connecting the top package to the redistribution structure, the interconnect structure including a substrate and a passive device formed in the substrate, wherein the interconnect structure is free of active devices.

19 Claims, 20 Drawing Sheets

(51) Int. Cl.
*H01L 21/768* (2006.01)
*H01L 25/18* (2006.01)

(56) References Cited

U.S. PATENT DOCUMENTS

| | | | |
|---|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 8,822,268 B1 * | 9/2014 | Magnus | H01L 23/5383 438/107 |
| 8,883,561 B2 * | 11/2014 | Park | H01L 21/4846 438/107 |
| 9,859,258 B2 * | 1/2018 | Chen | H01L 24/20 |
| 10,236,209 B2 * | 3/2019 | Sharan | H01L 21/78 |
| 10,321,575 B2 * | 6/2019 | Li | H01L 23/49811 |
| 2011/0241218 A1 * | 10/2011 | Meyer | H01L 21/568 257/774 |
| 2012/0056312 A1 * | 3/2012 | Pagaila | H01L 21/561 257/684 |
| 2013/0094157 A1 * | 4/2013 | Giuliano | H01L 23/5223 361/748 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2014/0367828 A1 * | 12/2014 | Colonna | H01G 4/236 257/532 |
| 2015/0287697 A1 | 10/2015 | Tsai et al. |
| 2015/0348872 A1 | 12/2015 | Kuo et al. |
| 2017/0250159 A1 * | 8/2017 | Lee | H01L 25/50 |

* cited by examiner

SEMICONDUCTOR DEVICE AND METHOD OF MANUFACTURE

CROSS-REFERENCE TO RELATED APPLICATIONS

This application claims the benefit of U.S. Provisional Application No. 62/688,607 filed on Jun. 22, 2018 and entitled Integrated Circuit Package and Method which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
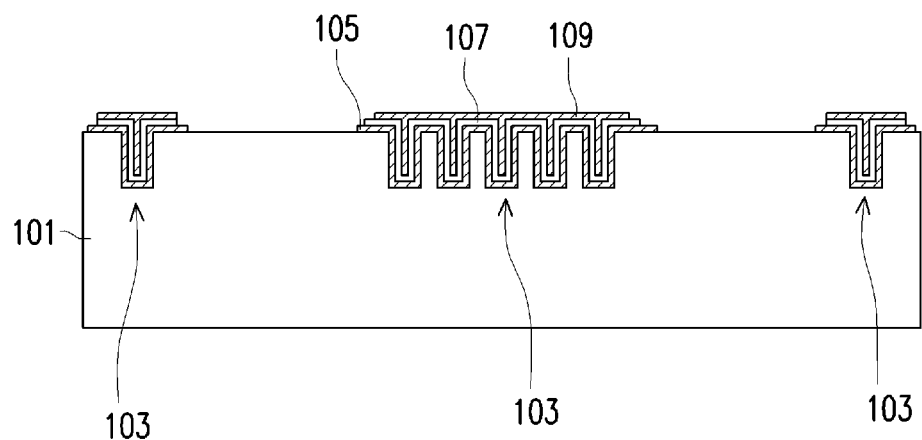
FIGS. 1-6 illustrate formation of an interconnect structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-6 illustrate the formation of an embodiment of an interconnect structure 650 according to some embodiments. With reference now to FIG. 1, there is shown a first substrate 101 and integrated passive devices (IPDs) 103. The first substrate 101 may include bulk silicon, doped or undoped, another semiconductor material, a silicon-on-insulator (SOI) substrate, silicon dioxide ($SiO_2$) or other insulating material, or another material. In some embodiments, the first substrate 101 has a thickness between about 50 µm and about 400 µm, such as about 150 µm. In the embodiments shown in FIGS. 1-6, the IPDs 103 are shown as deep-trench capacitors, though in other embodiments the IPDs 103 may include one or more other types of passive devices such as resistors, inductors, other types of capacitors, and the like.

The IPDs 103 may be formed using any suitable methods within or on the first substrate 101. For example, a deep-trench capacitor may be formed by first forming one or more trenches into the first substrate 101. The trenches may be formed by any suitable photolithographic mask and etching process. For example, a photoresist may be formed and patterned over the first substrate 101, and one or more etching processes (e.g., dry etch processes) may be utilized to remove those portions of the first substrate 101 where the deep-trench capacitors are desired. In some embodiments, the one or more trenches are formed having a depth between about 1 µm and about 15 µm. A first capacitor electrode may be formed by forming a first conductive electrode material 105 into the one or more trenches, such as through a deposition process or another process. Excess portions of the first conductive electrode material 105 may be removed using, for example, a suitable photolithographic mask and etching process. For example, a photoresist may be formed and patterned over the first conductive electrode material 105, and one or more etching processes (e.g., a wet etch process or a dry etch process) are utilized to remove excess portions of the first conductive electrode material 105. In some embodiments, remaining portions of the first conductive electrode material 105 may extend over top surfaces of the substrate 101. The first conductive electrode material 105 may be one or more layers of a conductive material such as doped silicon, polysilicon, copper, tungsten, an aluminum or copper alloy, the like, combinations thereof, or another conductive material. The first conductive electrode material 105 may be formed having a thickness between about 0.05 µm and about 1 µm.

A dielectric layer 107 may be formed over the first conductive electrode 105 material within the one or more trenches. The dielectric layer 107 may include high-K dielectric materials, an oxide, a nitride, or the like, or combinations or multiple layers thereof, and be formed using any suitable deposition process, such as a CVD process. Excess portions of the dielectric layer 107 may be removed using, for example, a suitable photolithographic mask and etching process. For example, a photoresist may be formed and patterned over the dielectric layer 107, and one or more etching processes (e.g., a wet etch process or a dry etch process) are utilized to remove excess portions of the dielectric layer 107. In some embodiments, remaining portions of the dielectric layer 107 may extend over portions of the first conductive electrode material 105 that are disposed on top surfaces of the substrate 101. The dielectric layer 107 may be formed having a thickness between about 1 nm and about 100 nm.

A second conductive electrode material 109 may be formed over the dielectric layer 107 in the one or more trenches to form a second capacitor electrode, such as through a deposition process or another process. Excess portions of the second conductive electrode material 109 may be removed using, for example, a suitable photolithographic mask and etching process. For example, a photoresist may be formed and patterned over the second conductive electrode material 109, and one or more etching processes (e.g., a wet etch process or a dry etch process) are utilized to remove excess portions of the second conductive electrode material 109. In some embodiments, remaining portions of the second conductive electrode material 109 may extend over portions of the dielectric layer 107 that are disposed over top surfaces of the substrate 101. The second conductive electrode material 109 may be one or more layers of a conductive material such as doped silicon, polysilicon, copper, tungsten, an aluminum or copper alloy, the like, combinations thereof, or another conductive material. The second conductive electrode material 109 may be formed having a thickness between about 0.05 µm and about 1 µm. The above described process for forming deep-trench capacitors is merely one method of forming the deep-trench capacitors, and other methods are also fully intended to be included within the scope of the embodiments.

The IPDs 103 may include one deep-trench capacitor or may include multiple deep-trench capacitors. In some embodiments, a deep-trench capacitor may include one trench or multiple trenches. For example, when forming a deep-trench capacitor, the first conductive electrode 105, dielectric layer 107, and the second conductive electrode material 109 may be formed over a single trench or may be formed extending over multiple trenches.

Figure 2:
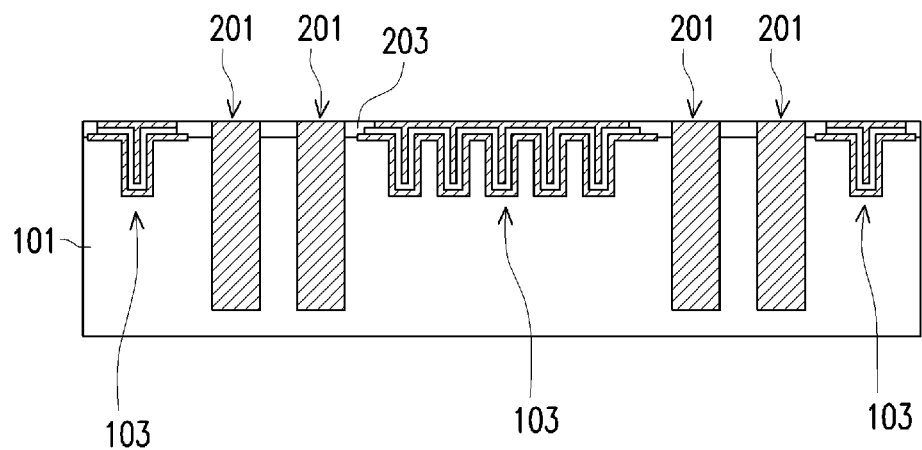

FIG. 2 illustrates the formation of through-substrate-vias (TSVs) 201 in the first substrate 101. The TSVs 201 may be formed, for example, by forming a dielectric layer 203 over the first substrate 101 and the IPDs 103, then etching openings through the dielectric layer 203 and into the first substrate 101, and then depositing a conductive material into the openings. The dielectric layer 203 may be, for example, one or more layers of an oxide, a nitride, a polymer, a combination, or another dielectric material. In an embodiment, the dielectric layer 203 covers the second conductive electrode material 109 after formation. The dielectric layer 203 is then thinned to expose the second conductive electrode material 109. The thinning may be performed, e.g., using a mechanical grinding or CMP process. Openings into the first substrate 101 may be formed using a suitable photolithographic mask and etching process. For example, a photoresist may be formed and patterned over the dielectric layer 203 and the first substrate 101, and one or more etching processes (e.g., a wet etch process or a dry etch process) are utilized to remove those portions of the dielectric layer 203 and the first substrate 101 where the TSVs 201 are desired. Once the openings for the TSVs 201 have been formed, the openings for the TSVs 201 may be filled with, e.g., a barrier layer and a conductive material. The barrier layer may include a conductive material such as titanium nitride, although other materials, such as tantalum nitride, titanium, a dielectric material, or the like may be utilized. The barrier layer may be formed using a CVD process, such as PECVD. However, other alternative processes, such as sputtering or metal organic chemical vapor deposition (MOCVD), may be used. The barrier layer may be formed so as to contour to the underlying shape of the opening for the TSVs 201.

The conductive material may include one or more conductive materials, such as copper, tungsten, other conductive metals, the like, or a combination. The conductive material may be formed, for example, by depositing a seed layer (not separately illustrated) and using electroplating, electroless plating, or the like to deposit conductive material onto the seed layer, filling and overfilling the openings for the TSVs 201. Once the openings for the TSVs 201 have been filled, excess barrier layer and excess conductive material outside of the openings for the TSVs 201 (e.g., over the dielectric layer 203) may be removed through a grinding process such as chemical mechanical polishing (CMP), although any suitable removal process may be used. In some embodiments, the grinding process exposes the conductive material of the TSVs 201 and/or the second conductive electrode material 109. In an embodiment, the TSVs 201 have a width between about 5 µm and about 50 µm, such as about 10 µm. The above-described process for forming the TSVs 201 is merely one method of forming the TSVs 201, and other methods are also fully intended to be included within the scope of the embodiments.

The example structure shown in FIGS. 1-6 includes four TSVs 201, but in other embodiments, the structure can include another number of TSVs 201. For example, a structure may include two TSVs 201, three TSVs 201, six TSVs 201, or another number of TSVs 201. Furthermore, the TSVs 201 are shown as being arranged in adjacent pairs of TSVs 201 for illustrative purposes only. In other embodiments, a TSV 201 may be formed without being adjacent to another TSV 201, or may be formed adjacent to two or more TSVs 201. As described below, adjacent TSVs 201 may be electrically connected within the first interconnect layer 301 and/or by metal contacts 603 (see FIG. 6). The use of multiple TSVs 201 that are electrically connected may reduce resistance and improve electrical performance. These and other configurations of TSVs 201 are fully intended to be included within the scope of the embodiments.

Figure 3:
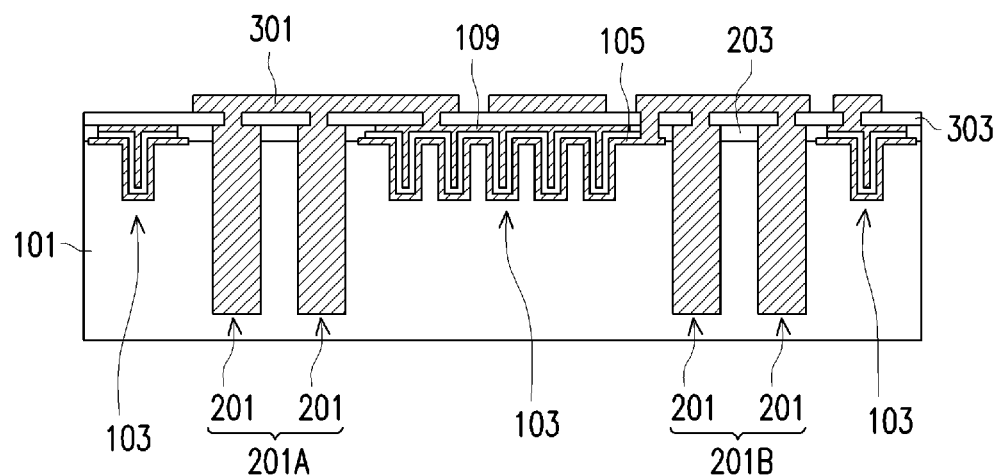

Turning to FIG. 3, a first interconnect layer 301 is formed over the first substrate 101 and is designed to provide electrical connections to and between the various IPDs 103 and TSVs 201. In some embodiments, the first interconnect layer 301 may be formed making electrical connection to the IPDs 103 and TSVs 201 through, e.g., conductive lines, traces, or vias. For example, in some embodiments, a first insulating layer 303 is formed over the first substrate 101. The first insulating layer 303 may be made of one or more suitable dielectric materials such as an oxide (e.g., silicon oxide), a nitride (e.g., silicon nitride), a polymer material, a low-k dielectric material, another dielectric material, combinations of these, or the like. The first insulating layer 303 may be formed by a process such as spin-coating, lamination, CVD, the like, or a combination thereof. The first insulating layer 303 may have a thickness of between about 0.1 µm and about 15 µm, although any suitable thickness may be used.

Openings into the first insulating layer 303 may be formed using a suitable photolithographic mask and etching process. For example, a photoresist may be formed and patterned over the first insulating layer 303, and one or more etching processes (e.g., a wet etch process or a dry etch process) are utilized to remove portions of the first insulating layer 303 to expose regions of the second conductive electrode material 109 or the TSVs 201. In some embodiments, portions of the dielectric layer 203 may also be removed to expose portions of the first conductive electrode material 105.

In an embodiment, the first interconnect layer 301 may be formed by initially forming a seed layer (not shown) of one or more layers of titanium, copper, or a titanium copper alloy through a suitable formation process such as PVD, CVD, sputtering, or the like. The seed layer is formed over the first insulating layer 303 and over exposed regions of the first conductive electrode material 105, the second conductive electrode material 109, or the TSVs 201. A photoresist (also not shown) may then be formed to cover the seed layer and then be patterned to expose those portions of the seed layer that are located where the first interconnect layer 301 will subsequently be formed. Once the photoresist has been formed and patterned, a conductive material may be formed on the seed layer. The conductive material may be a material such as copper, titanium, tungsten, aluminum, another metal, a combination, or the like. The conductive material may be formed through a deposition process such as electroplating or electroless plating, or the like. However, while the material and methods discussed are suitable to form the conductive material, these materials are merely exemplary. Any other suitable materials or any other suitable processes of formation, such as CVD or PVD, may alternatively be used to form the first interconnect layer 301. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the first interconnect layer 301.

In some embodiments, the first interconnect layer 301 includes multiple layers of dielectric and conductive material and may be formed through any suitable process (such as a suitable photolithographic mask and etching process, deposition, damascene, dual damascene, etc.). In some embodiments, the material of the first insulating layer 303 is the same as the material of the dielectric layer 203, but may be different in other embodiments.

The first interconnect layer 301 may be configured to electrically connect adjacent TSVs 201, and also may be configured to connect the TSVs 201 to the IPDs 103. In some embodiments in which the IPDs 103 include deep-trench capacitors, the first interconnect layer 301 may connect one TSV 201 (or a group of adjacent TSVs 201) to a first electrode (e.g., to the first conductive electrode material 105) of one or more deep-trench capacitors and connect another TSV 201 (or another group of adjacent TSVs 201) to a second electrode (e.g., to the second conductive electrode material 109) of the one or more deep-trench capacitors. For example, as shown in FIG. 3, the TSVs labeled 201A are connected to the second conductive electrode material 109 of IPDs 103 through the first interconnect layer 301, and the TSVs labeled 201B are connected to the first conductive material 105 of IPDs 103 through the first interconnect layer 301. This is an illustrative example, and other configurations are possible. In some embodiments, the one or more TSVs 201 connected to the first electrode may be configured to conduct a first voltage or first current, and the one or more TSVs 201 connected to the second electrode may be configured to conduct a second voltage or second current. In some embodiments, a TSV 201 may be configured to transmit a supply voltage, which, for example, may be a positive voltage, a negative voltage, or a ground. In some embodiments, a TSV 201 may be configured to conduct an electrical signal, such as a voltage signal or a current signal. As a non-limiting example, during operation of the package structure 1450 described below in FIG. 14, one or more TSVs 201 may transmit electrical signals between the redistribution structure 1001 and the top package 1400, and/or one or more TSVs 201 may transmit a supply voltage from the redistribution structure 1001 to the top package 1400.

Figure 4:
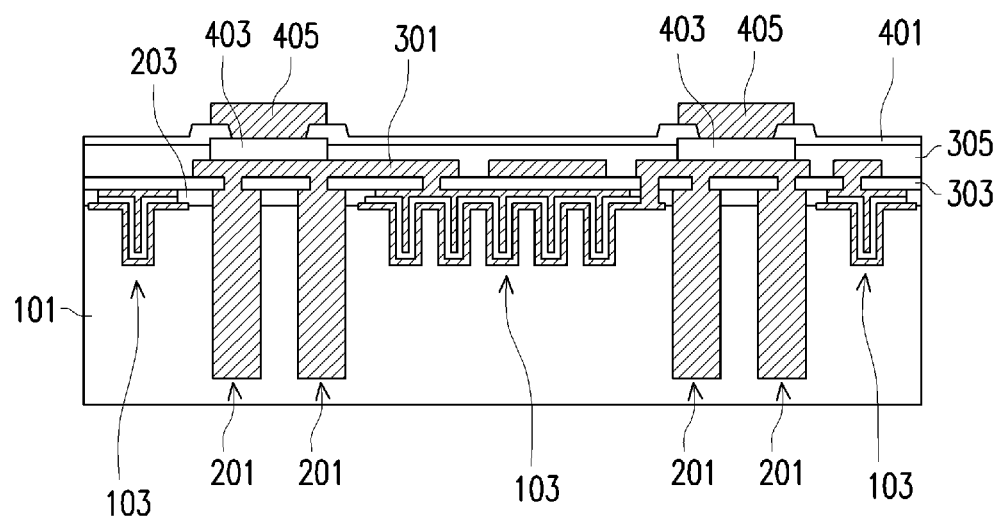

With reference now to FIG. 4, there is shown a second insulating layer 305, a first protective layer 401, bonding pads 403, and first external connectors 405. In an embodiment, the second insulating layer 305 is formed over the first interconnect layer 301 and the first insulating layer 303 in a process and with materials similar to the first insulating layer 303. Alternatively, the second insulating layer 305 may be formed differently than the first insulating layer 303. The second insulating layer 305 may have a thickness of between about 0.1 µm and about 15 µm, although any suitable thickness may be used. After forming the second insulating layer 305, openings may be formed through the second insulating layer 305 in order to expose a portion of the first interconnect layer 301 for forming further connections. The openings may be formed through a suitable masking and removal process, such as a suitable photolithographic masking and etching process.

The bonding pads 403 may then be formed over and in electrical contact with the first interconnect layer 301. The bonding pads 403 may include one or more conductive materials such as copper, titanium, tungsten, aluminum, another metal, a combination, or the like. The conductive material of the bonding pads 403 may be formed using a deposition process such as electroplating or electroless plating, or the like. However, while the material and methods discussed are suitable to form the conductive material, these materials are merely exemplary. Any other suitable materials or any other suitable processes of formation, such as CVD or PVD, may alternatively be used to form the bonding pads 403. In some embodiments, the bonding pads 403 may be formed in a manner or using a material similar to that of the first interconnect layer 301 (see FIG. 3). The bonding pads 403 may have a thickness of between about 0.5 µm and about 10 µm, such as about 3 µm, although any suitable thickness may be used.

The first protective layer 401 may be formed over the first metallization layer 301 and the bonding pads 403 in order to protect the first interconnect layer 301 and the bonding pads 403 from physical and environmental damage during subsequent processing and environments. The first protective layer 401 may be formed from one or more suitable dielectric materials such as silicon oxide, silicon nitride, low-k dielectrics such as carbon doped oxides, extremely low-k dielectrics such as porous carbon doped silicon dioxide, combinations of these, or the like. In some embodiments, the first protective layer 401 may be polybenzoxazole (PBO), although any suitable material, such as polyimide or a polyimide derivative, may be utilized. The first protective layer 401 may be formed by a process such as spin-coating, lamination, CVD, the like, or a combination thereof. The first protective layer 401 may have a thickness of between about 0.5 µm and about 10 µm, such as about 3 µm, although any suitable thickness may be used.

After forming the first protective layer 401, openings may be formed through the first protective layer 401 in order to expose a portion of the bonding pads 403 for forming further connections. The openings may be formed through a suitable masking and removal process, such as a suitable photolithographic masking and etching process. The disclosed patterning process discussed, however, is merely intended as a representative process, and any other suitable patterning process may be utilized to expose a portion of the bonding pads 403.

In an embodiment, the first external connectors 405 may be conductive pillars (e.g., copper pillars or copper posts). The first external connections 405 may be formed, for example, by deposition, electroplating, electroless plating, or the like. For example a seed layer (not shown) may first be formed within the openings of both the first protective layer 401 and the photoresist, and then the material of the first external connections 405 grown on the seed layer using a suitable technique. Once the first external connections 405 have been formed using the photoresist, the photoresist and excess material of the seed layer may be removed using a suitable removal process, such as an ashing process or a wet chemical clean. The removal of the photoresist may expose the first external connections 405 such that the first external connections 405 protrude past the surface of the first protective layer 401. However, the embodiments are not limited to these pillars, and may be solder bumps, copper bumps, or include one or more conductive materials, such as copper, tungsten, other conductive metals, or the like. Other suitable first external connections 405 may be made to provide electrical connection. All such external contacts are fully intended to be included within the scope of the embodiments.

Figure 5:
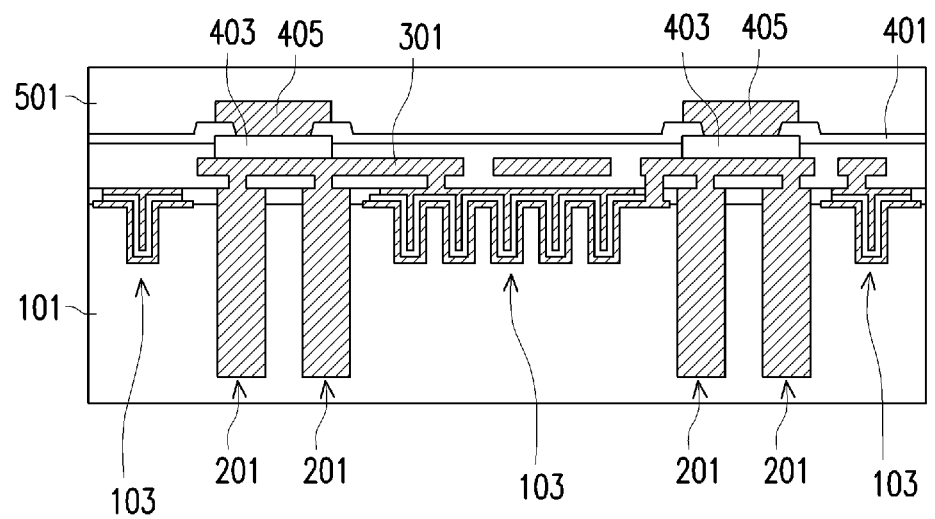

Turning to FIG. 5, a Die Attach Film (DAF) 501 is formed over the first protective layer 401 and the first external connectors 405. The DAF 501 may include a material such as epoxy resin, a phenol resin, acrylic rubber, silica filler, an adhesive layer, a polymer material, or a combination thereof, and is applied using a lamination technique or another suitable technique. The DAF 501 may be formed having a thickness between about 1 µm and about 50 µm, such as about 20 µm, although any suitable thickness may be used.

Figure 6:
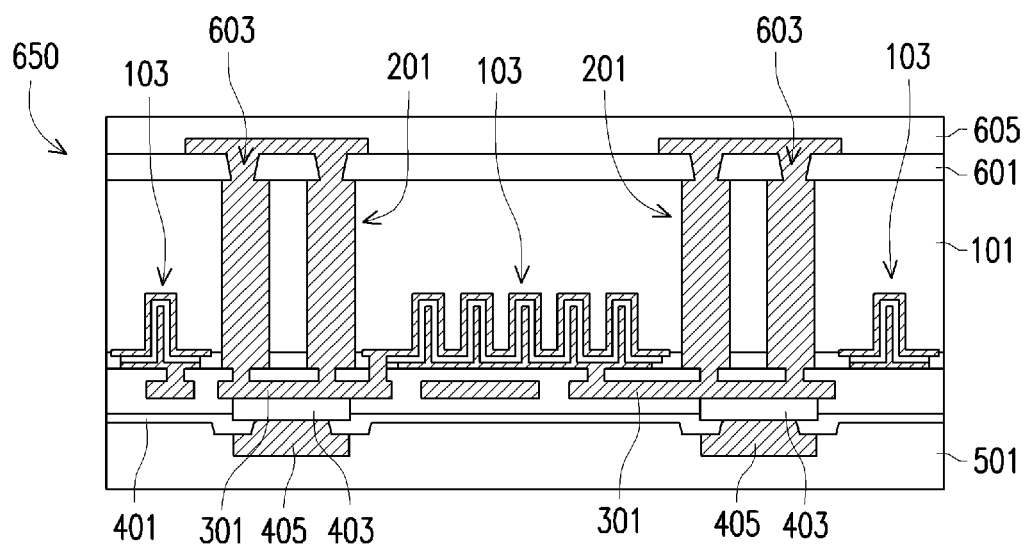

Turning to FIG. 6, a thinning process is performed on the backside of the first substrate 101 to expose the TSVs 201 for further processing, and metal contacts 603 are formed. The structure shown in FIG. 6 is in an upside-down orientation with respect to the orientation of FIGS. 1-5. The thinning of the first substrate 101 may be performed (e.g., using a mechanical grinding or a CMP process) until the conductive material of the TSVs 201 has been exposed. In this manner, the TSVs 201 may be formed to have a first thickness of between about 50 µm and about 200 µm, such as about 100 µm. In an embodiment, the TSVs 201 have a cross-sectional thickness:width aspect ratio of between about 3:1 and about 15:1, such as about 5:1. Optionally, after the first substrate 101 has been thinned, the TSVs 201 may be recessed within the first substrate 101. In some embodiments, an additional etch may be performed on the first substrate 101 such that the TSVs 201 protrude from the first substrate 101. In an embodiment, the TSVs 201 may be recessed using, e.g., an etching process that utilizes an etchant that is selective to the material of the TSVs 201 (e.g., selective to copper).

With reference now to FIG. 6, there is shown a second protective layer 601 and metal contacts 603 covered by a third protective layer 605. The metal contacts 603 may be formed in order to interconnect the TSVs 201 and an external semiconductor device (described below). In an embodiment, the second protective layer 601 is formed over the backside of the first substrate 101. In some embodiments, the second protective layer 601 is a polymer material. In some embodiments, the second protective layer 601 includes one or more of the same materials described above with respect to the first insulating layer 303 or the first protective layer 401. The second protective layer 601 may be formed using a process similar to those described above with respect to the first insulating layer 303 or the first protective layer 401. In other embodiments, the second protective layer 601 may be formed in a different manner and from different materials than those described for the first insulating layer 303 or the first protective layer 401. The second protective layer 601 may be formed having a thickness between about 5 µm and about 25 µm, such as about 7 µm, although any suitable thickness may be used.

Openings into the second protective layer 601 may be formed using a suitable photolithographic mask and etching process. For example, a photoresist may be formed and patterned over the second protective layer 601, and one or more etching processes (e.g., a wet etch process or a dry etch process) are utilized to remove portions of the second protective layer 601 to expose regions of the TSVs 201.

In an embodiment, the metal contacts 603 may be formed by initially forming a seed layer (not shown) of one or more layers of titanium, copper, or a titanium copper alloy through a suitable formation process such as PVD, CVD, sputtering, or the like. The seed layer is formed over the second protective layer 601 and over exposed regions of the TSVs 201. A photoresist (also not shown) may then be formed to cover the seed layer and then be patterned to expose those portions of the seed layer that are located where the metal contacts 603 will subsequently be formed. Once the photoresist has been formed and patterned, a conductive material may be formed on the seed layer. The conductive material may be a material such as copper, titanium, tungsten, aluminum, another metal, a combination, or the like. The conductive material may be formed through a deposition process such as electroplating or electroless plating, or the like. However, while the material and methods discussed are suitable to form the conductive material, these materials are merely exemplary. Any other suitable materials or any other suitable processes of formation, such as CVD or PVD, may alternatively be used to form the first metal contacts 603. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the metal contacts 603.

The metal contacts 603 may be formed using other techniques in other embodiments. For example, the metal contacts 603 may be formed using a deposition process, such as sputtering, to form a layer of conductive material, and portions of the layer of material may then be removed through a suitable process (such as photolithographic masking and etching). As shown in FIG. 6, the metal contacts 603 may extend over and electrically connect two or more TSVs 201, though in some embodiments, some TSVs 201 may not be electrically connected by a metal contact 603. The metal contact 603 may be formed having a thickness between about 5 µm and about 25 µm, such as about 7 µm, although any suitable thickness may be used As shown in FIG. 6, a third protective layer 605 is formed over the second protective layer 601 and the metal contacts 603. In an embodiment the third protective layer 605 may be a polymer such as polybenzoxazole (PBO), although any suitable material, such as polyimide or a polyimide derivative, Solder Resistance (SR), Ajinomoto build-up film (ABF), or another material may alternatively be used. The third protective layer 605 may be placed using, e.g., a spin-coating process to a thickness between about 5 µm and about 25 µm, such as about 7 µm, although any suitable method and thickness may alternatively be used. In some embodiments, a DAF material may be used for the third protective layer 605, such as those described above with respect to DAF 501. In some embodiments, the third protective layer 605 is optional and may be omitted.

In this manner, an interconnect structure 650 including IPDs 103 and TSVs 201 may be formed, shown in FIG. 6. In some embodiments, multiple interconnect structures 650 may be formed using a single substrate and then singulated to form individual interconnect structures 650. In some embodiments, the interconnect structure 650 includes passive devices and does not include active devices. The process shown in FIGS. 1-6 is an example process for forming an interconnect structure 650, and in other embodiments an interconnect structure 650 may be formed using other suitable techniques or processes, which are considered within the scope of this disclosure.

Figure 7:
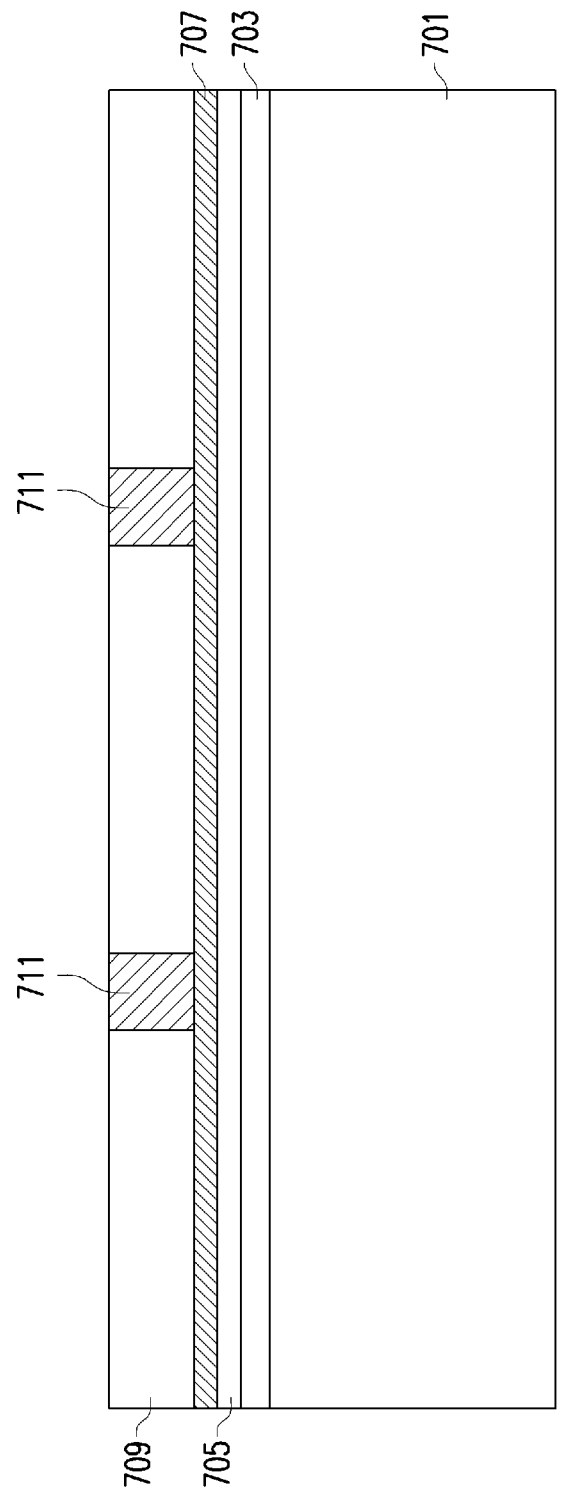
FIGS. 7-14 illustrate formation of a package structure incorporating interconnect structures, in accordance with some embodiments.

In some embodiments, an interconnect structure such as interconnect structure 650 may be incorporated in an integrated fan out package-on-package (InFO-POP), discussed below with respect to FIGS. 7-15. With reference now to FIG. 7, there is shown a carrier substrate 701 with release layer 703, a fourth protective layer 705, and a first seed layer 707 over the carrier substrate 701. The carrier substrate 701 may include, for example, silicon based materials, such as a glass material or silicon oxide, or other materials, such as aluminum oxide, combinations of these, or the like. The carrier substrate 701 may be planar in order to accommodate an attachment of semiconductor devices such as the interconnect structure 850 and a semiconductor device 801, described below.

The release layer 703 may be formed of a polymer-based material, which may be removed along with the carrier substrate 701 from the overlying structures that will be formed in subsequent steps. In some embodiments, the release layer 703 is an epoxy-based thermal-release material, which loses its adhesive property when heated, such as a Light-to-Heat-Conversion (LTHC) release coating. In other embodiments, the release layer 703 may be an ultraviolet (UV) glue, which loses its adhesive property when exposed to UV light. The release layer 703 may be dispensed as a liquid and cured, may be a laminate film laminated onto the carrier substrate 701, or the like. The top surface of the release layer 703 may be leveled and may have a high degree of co-planarity.

The fourth protective layer 705 is placed over the release layer 703 and is utilized in order to provide protection to, e.g., an interconnect structure 850 or a first semiconductor device 801, described below. In an embodiment, the fourth protective layer 705 may be a polymer material such as polybenzoxazole (PBO), although any suitable material, such as polyimide or a polyimide derivative, Solder Resistance (SR), Ajinomoto build-up film (ABF), or another material may alternatively be used. The fourth protective layer 705 may be placed using, e.g., a spin-coating process to a thickness between about 2 µm and about 15 µm, such as about 5 µm, although any suitable method and thickness may alternatively be used.

The first seed layer 707 is formed over the fourth protective layer 705. In an embodiment, the first seed layer 707 is a thin layer of a conductive material that aids in the formation of a thicker layer during subsequent processing steps. The first seed layer 707 may, for example, include a layer of titanium followed by a layer of copper, though other materials or combinations of materials may be used. The first seed layer 707 may be created using processes such as sputtering, evaporation, or PECVD processes, depending upon the desired materials. The first seed layer 707 may be formed to have a thickness between about 0.3 µm and about 1 µm, such as about 0.5 µm.

FIG. 7 also illustrates a placement and patterning of a through via mask 709 over the first seed layer 707. In an embodiment, the through via mask 709 may comprise a photoresist and may be placed on the first seed layer 707 using, e.g., a spin-coating technique to a height of between about 50 µm and about 250 µm, such as about 120 µm. Once in place, the through via mask 709 may then be patterned using suitable photolithography techniques. In an embodiment, the pattern formed into the through via mask 709 exposes portions of the first seed layer 707 for formation of vias 711. In some embodiments, the vias 711 are through-vias or other conductive elements formed so as to be located on different sides of or the same side of subsequently attached devices such as the first semiconductor device 801 or interconnect structure 650. However, any suitable arrangement for the pattern of vias 711 may alternatively be utilized. FIG. 7 shows two vias 711, but in other embodiments more or fewer vias 711 may be formed.

In an embodiment, the vias 711 include one or more conductive materials such as copper, tungsten, other conductive materials, or the like. The vias 711 may be formed, for example, by electroplating, electroless plating, or the like. Once the vias 711 have been formed, the photoresist 709 may be removed using a suitable removal process such as a wet chemical etch or an ashing process. The removal of the photoresist 709 may expose the underlying portions of the first seed layer 707. The exposed portions of the first seed layer 707 may then be removed by, for example, a wet or dry etching process. After the exposed portions of the first seed layer 707 have been removed, portions of the fourth protective layer 705 are exposed between the vias 711.

Figure 8:
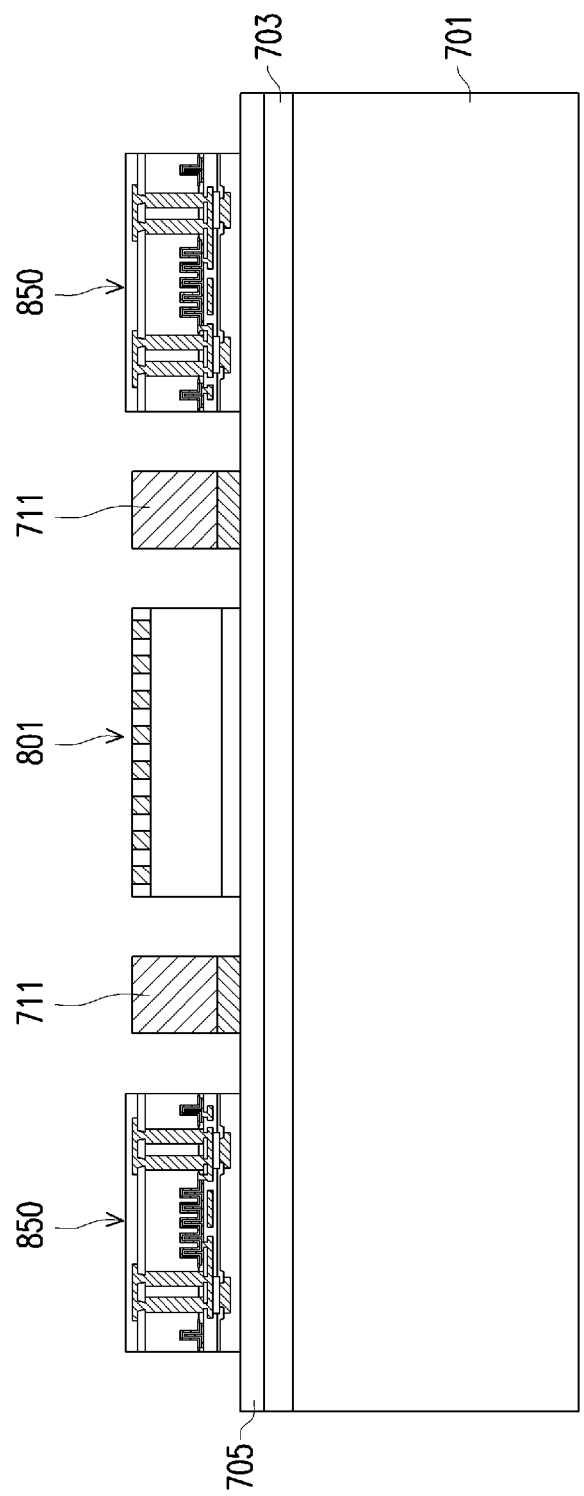

FIG. 8 illustrates a placement of a first semiconductor device 801 and multiple interconnect structures 850 onto the fourth protective layer 705. One or more of the interconnect structures 850 shown in FIG. 8 may be similar to the interconnect structure 650 described above with respect for FIG. 6 or may be similar to interconnect structures 852, 854, or 856 described with respect to FIGS. 16A-19C, though in some embodiments, one or more of the interconnect structures 850 may be different than interconnect structures 650, 852, 854, or 856. In some embodiments, different interconnect structures 850 placed on the fourth protective layer 705 may have different features, such as different configurations of TSVs 201, different IPDs 103, or other different features. In some embodiments, more or fewer interconnect structures 850 may be present than shown in FIG. 8. In some embodiments, one or more interconnect structures 850 may be placed between two vias 711 or between a via 711 and the first semiconductor device 801. The interconnect structure 850 may be placed in an orientation such that the IPDs (e.g., IPDs 103) are facing toward the fourth protective layer 705, though in other embodiments the interconnect structure 850 may be oriented such that the IPDs are facing away from the fourth protective layer 705.

The first semiconductor device 801 shown in FIG. 8 may be a semiconductor device designed for an intended purpose such as a memory die (e.g., a DRAM die), a logic die, a central processing unit (CPU) die, combinations of these, or the like. In an embodiment, the first semiconductor device 801 includes integrated circuit devices, such as transistors, capacitors, inductors, resistors, metallization layers, external connectors, and the like, therein, as desired for a particular functionality.

In an embodiment, the interconnect structures 850 and the first semiconductor device 801 may be placed onto the fourth protective layer 705 using, e.g., a pick-and-place process. However, any other alternative method of placing the interconnect structures 850 or the first semiconductor device 801 may be used.

Figure 9:
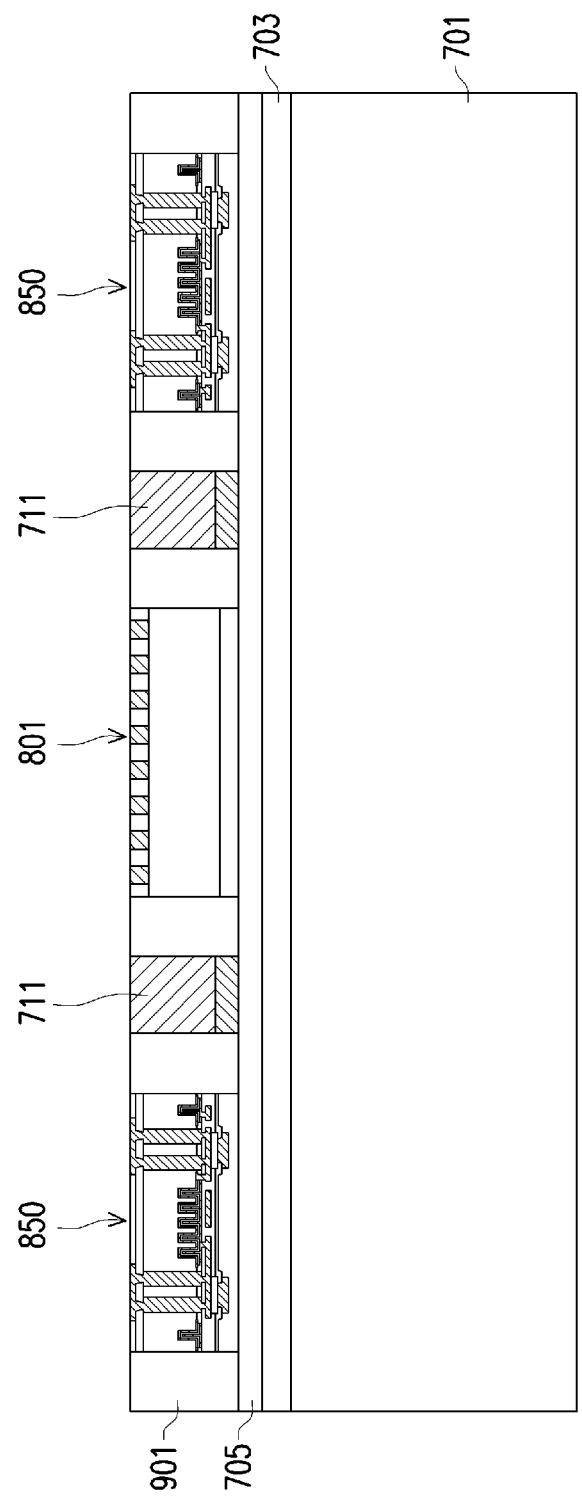

FIG. 9 illustrates an encapsulation of the vias 711, the first semiconductor device 801, and the interconnect structures 850 using an encapsulant 901. The encapsulation may be performed in a molding device or the encapsulant 901 may be deposited using another technique. The encapsulant 901 may be a molding compound such as a resin, polyimide, PPS, PEEK, PES, another material, combinations of these, or the like. FIG. 9 also illustrates a thinning of the encapsulant 901 in order to expose the vias 711, metal contacts of the first semiconductor device 801, and metal contacts (e.g., metal contacts 603) of the interconnect structures 850 for further processing. The thinning may be performed, e.g., using a mechanical grinding or chemical mechanical polishing (CMP). As such, the vias 711, the first semiconductor device 801, and the interconnect structures 850 may have a planar surface that is also planar with the encapsulant 901.

Figure 10:
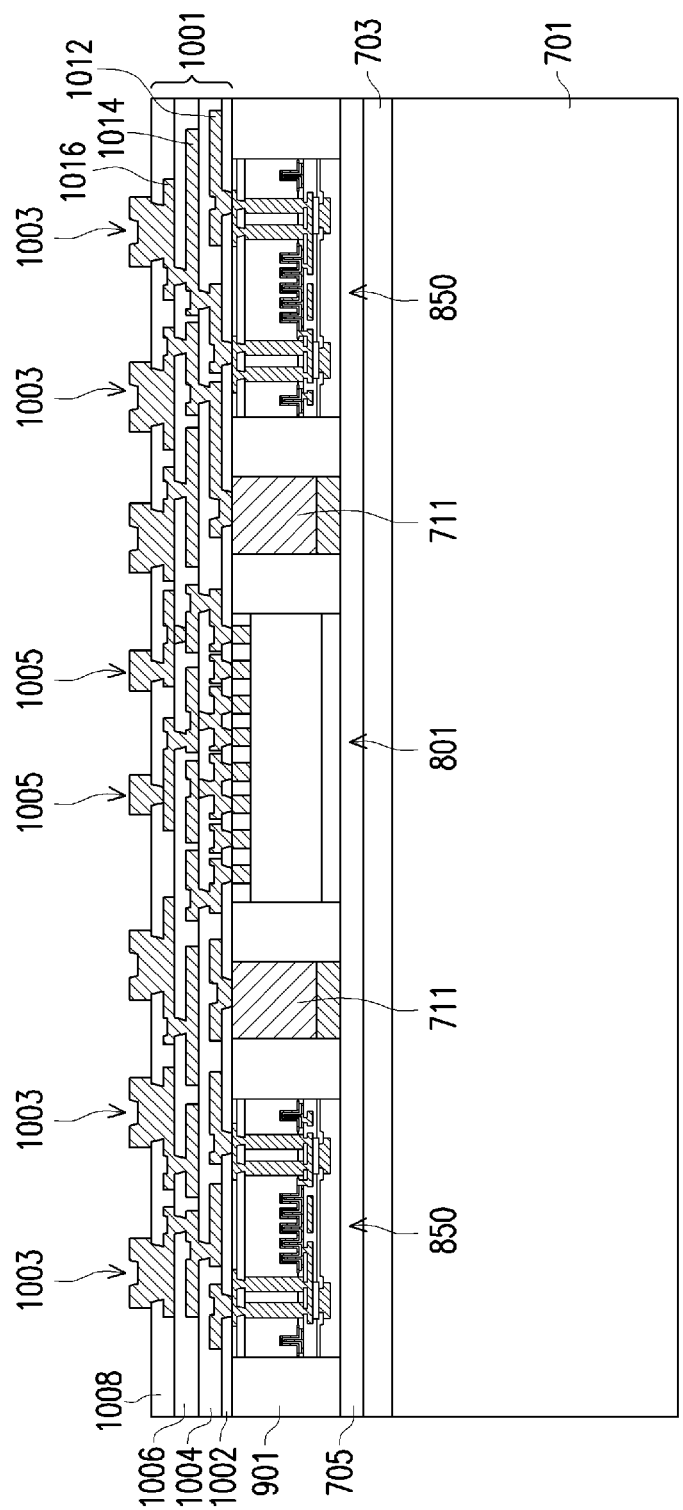

FIG. 10 illustrates the formation of a redistribution structure 1001 in order to interconnect the vias 711, the first semiconductor device 801, and the interconnect structures 850 with second external connectors 1101 and an IPD device 1103 (described below). In an embodiment, the redistribution structure 1001 may be formed by forming a stack of conductive layers 1012, 1014, and 1016 and insulating layers 1002, 1004, 1006, and 1008.

In an embodiment, a third insulating layer 1002 is formed over the encapsulant 901, the vias 711, the first semiconductor device 801, and the interconnect structures 850. The third insulating layer 1002 may be made of one or more suitable dielectric materials such as an oxide (e.g., silicon oxide), a nitride (e.g., silicon nitride), a polymer material, a low-k dielectric material, another dielectric material, combinations of these, or the like. The third insulating layer 1002 may be formed by a process such as spin-coating, lamination, CVD, the like, or a combination thereof. The third insulating layer 1002 may have a thickness of between about 5 μm and about 25 μm, such as about 7 μm, although any suitable thickness may be used. In an embodiment the third insulating layer 1002 is thinned using a grinding or CMP process.

Openings into the third insulating layer 1002 may be formed using a suitable photolithographic mask and etching process. For example, a photoresist may be formed and patterned over the third insulating layer 1002, and one or more etching processes (e.g., a wet etch process or a dry etch process) are utilized to remove portions of the third insulating layer 1002 to expose regions of the vias 711, the first semiconductor device 801, and the interconnect structures 850.

In an embodiment, the first conductive layer 1012 may be formed by initially forming a seed layer (not shown) of one or more layers of titanium, copper, or a titanium copper alloy through a suitable formation process such as PVD, CVD, sputtering, or the like. The seed layer is formed over the third insulating layer 1002 and over exposed regions of the vias 711, the first semiconductor device 801, and the interconnect structures 850. A photoresist (also not shown) may then be formed to cover the seed layer and then be patterned to expose those portions of the seed layer that are located where the first conductive layer 1012 will subsequently be formed. Once the photoresist has been formed and patterned, a conductive material may be formed on the seed layer. The conductive material may be a material such as copper, titanium, tungsten, aluminum, another metal, a combination, or the like. The conductive material may be formed through a deposition process such as electroplating or electroless plating, or the like. However, while the material and methods discussed are suitable to form the conductive material, these materials are merely exemplary. Any other suitable materials or any other suitable processes of formation, such as CVD or PVD, may alternatively be used to form the first conductive layer 1012. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the first conductive layer 1012.

In an embodiment, a fourth insulating layer 1004 is formed over the first conductive layer 1012 in a process and with materials similar to the third insulating layer 1002. Alternatively, the fourth insulating layer 1004 may be formed differently than the third insulating layer 1002. In an embodiment the fourth insulating layer 1004 is thinned, e.g., using a grinding or CMP process. After the fourth insulating layer 1004 has been formed, openings may be made through the fourth insulating layer 1004 by removing portions of the fourth insulating layer 1004 to expose at least a portion of the underlying first conductive layer 1012. The openings allow for contact between the first conductive layer 1012 and a second conductive layer 1014 (described further below). The openings may be formed using a suitable photolithographic mask and etching process, although any suitable process to expose portions of the first conductive layer 1012 may alternatively be used.

The second conductive layer 1014 may be formed to provide additional routing along with electrical connection within the conductive structure 1001. In an embodiment the second conductive layer 1014 may be formed using materials and processes similar to the first conductive layer 1012. For example, a seed layer may be formed, a photoresist may be placed and patterned on top of the seed layer in a desired pattern for the second conductive layer 1014, conductive material is plated into the patterned openings of the photoresist, the photoresist is removed, and the seed layer is etched.

After the second conductive layer 1014 has been formed, a fifth insulating layer 1006 may be formed over the second conductive layer 1014. In an embodiment the fifth insulating layer 1006, which may be similar to the third insulating layer 1002 or the fourth insulating layer 1004, may be formed from a polymer such as PBO, or may be formed of a similar material as the third insulating layer 1002 or the fourth insulating layer 1004 (e.g., polyimide or a polyimide derivative). The fifth insulating layer 1006 may be formed to have a thickness of between about 2 µm and about 15 µm, such as about 5 µm.

After the fifth insulating layer 1006 has been formed, openings may be made through the fifth insulating layer 1006 by removing portions of the fifth insulating layer 1006 to expose at least a portion of the underlying second conductive layer 1014. The opening allows for contact between the second conductive layer 1014 and the third conductive layer 1016. The openings may be formed using a suitable photolithographic mask and etching process, although any suitable process to expose portions of the second conductive layer 1014 may be used.

The third conductive layer 1016 may be formed to provide additional routing along with electrical connection within the redistribution structure 1001. In an embodiment the third conductive layer 1016 may be formed using materials and processes similar to the first conductive layer 1012 or the second conductive layer 1014. For example, a seed layer may be formed, a photoresist may be placed and patterned on top of the seed layer in a desired pattern for the third conductive layer 1016, conductive material is plated into the patterned openings of the photoresist, the photoresist is removed, and the seed layer is etched.

After the third conductive layer 1016 has been formed, a sixth insulating layer 1008 may be formed over the third conductive layer 1016. In an embodiment the sixth insulating layer 1008, which may be similar to the third insulating layer 1002, the fourth insulating layer 1004, or the fifth insulating layer 1006, may be formed from a polymer such as PBO, or may be formed of a similar material as the third insulating layer 1002, the fourth insulating layer 1004, or the fifth insulating layer 1006 (e.g., polyimide or a polyimide derivative). The sixth insulating layer 1008 may be formed to have a thickness of between about 2 µm and about 15 µm, such as about 5 µm.

As shown in FIG. 10, openings are then made through the sixth insulating layer 1008 by removing portions of the sixth insulating layer 1008 to expose at least a portion of the underlying third conductive layer 1016. UBMs 1003 and connectors 1005 are then formed within the openings to make electrical connections with overlying structures and with the redistribution layer 1001 though the third redistribution layer 1016. The openings may be formed using a suitable photolithographic mask and etching process, although any suitable process may be used.

The UBMs 1003 and the connectors 1005 may, for example, include three layers of conductive materials, such as a layer of titanium, a layer of copper, and a layer of nickel. However, other arrangements of materials and layers may be used, such as an arrangement of chrome/chrome-copper alloy/copper/gold, an arrangement of titanium/titanium tungsten/copper, or an arrangement of copper/nickel/gold, that are suitable for the formation of the UBMs 1003. Any suitable materials or layers of material that may be used for the UBMs 1003 and the connectors 100 are fully intended to be included within the scope of the current application. The UBMs 1003 and the connectors 1005 may be created by forming each layer over the redistribution structure 1001 and within the openings therein. The forming of each layer may be performed using a plating process, such as electroplating or electroless plating, although other processes of formation, such as sputtering, evaporation, or PECVD process, may alternatively be used depending upon the desired materials. Once the desired layers have been formed, portions of the layers may then be removed through a suitable photolithographic masking and etching process to remove the undesired material and to leave the UBMs 1003 and the connectors 1005 in a desired shape, such as a circular, octagonal, square, or rectangular shape, although any desired shape may alternatively be formed.

The connectors 1005 may be formed at the same time as the UBMs 1003 or in a separate step. Other types of suitable UBMs 1003 and the connectors 1005 may be made to provide electrical connection. For example, a seed layer may be formed over the sixth insulating layer 1008 and openings therein, a photoresist is placed and patterned on top of the seed layer in a desired pattern for the third conductive layer 1016, conductive material is plated into the patterned openings of the photoresist, the photoresist is removed, and the seed layer is etched. In an embodiment, the UBMs 1003 and the connectors 1005 may be, e.g., copper pillars or copper posts. All such external contacts are fully intended to be included within the scope of the embodiments.

Figure 11:
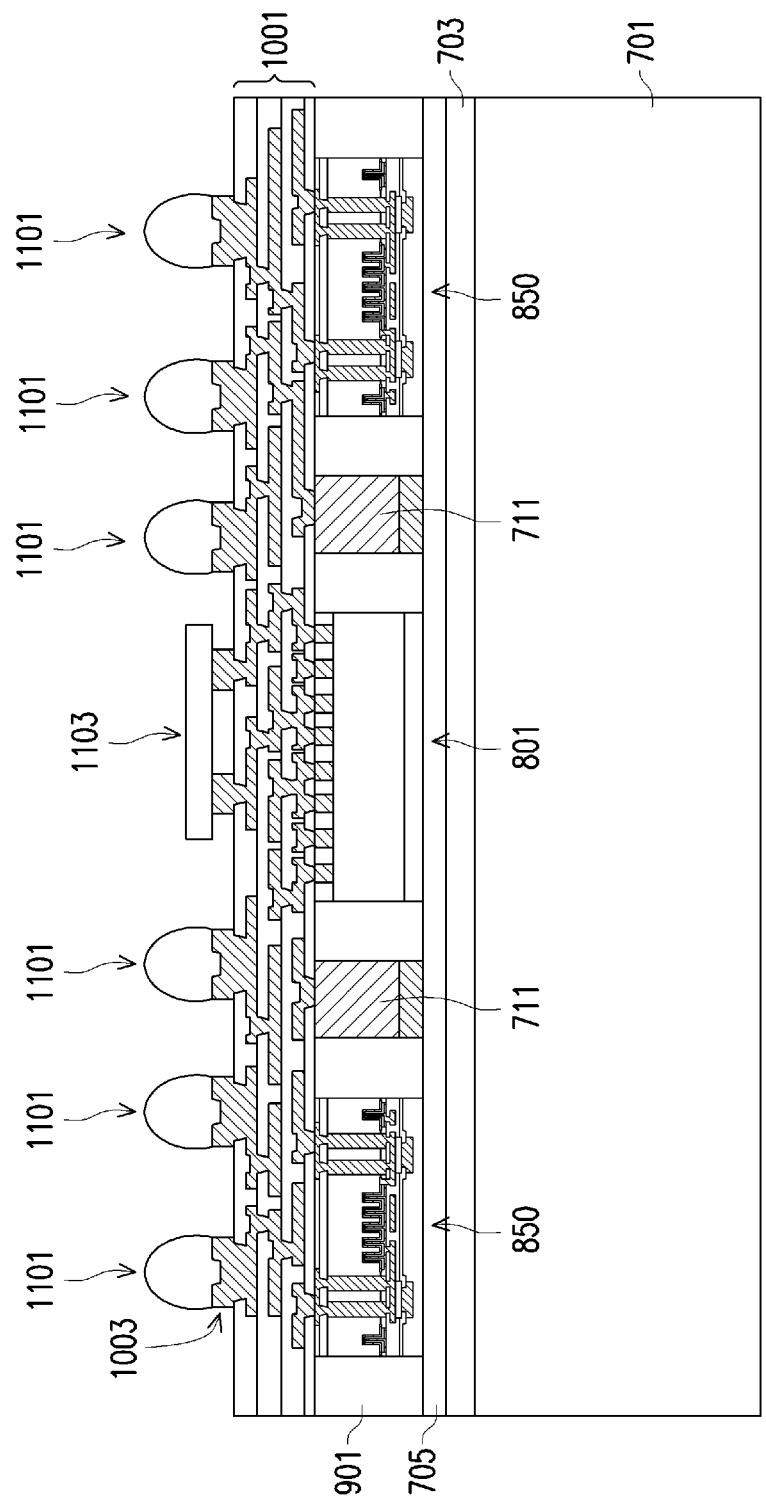

Turning to FIG. 11, second external connectors 1101 and an IPD device 1103 are formed over the UBMs 1003 and the connectors 1005 respectively. The second external connectors 1101 may be utilized to provide an external connection point for electrical connection to the redistribution structure 1001 and may be, for example, contact bumps or solder balls, although any suitable connection may be utilized. In an embodiment in which the second external connectors 1101 is a contact bump, the second external connectors 1101 may include a material such as tin, or other suitable materials, such as silver, lead-free tin, or copper. In an embodiment in which the second external connectors 1101 is a tin solder bump, the second external connectors 1101 may be formed by initially forming a layer of tin through such methods such as evaporation, electroplating, printing, solder transfer, ball placement, etc., to a thickness of, e.g., about 100 µm. Once a layer of tin has been formed on the structure, a reflow may be performed in order to shape the material into the desired bump shape.

As shown in FIG. 11, an IPD device 1103 is mounted to the connectors 1005 and is thus electrically connected to the redistribution structure 1001. The IPD device 1103 may be mounted to the connectors 1005 before or after formation of the second external connectors 1101. The IPD device 1103 may be connected to the connectors 1005, for example, by sequentially dipping connectors (e.g., conductive bumps or pads) of the IPD device 1103 such as solder balls (not shown) into flux, and then using a pick-and-place tool in order to physically align the connectors of the IPD device 1103 with individual ones of the connectors 1005. In some cases, a reflow may be performed to bond the connectors of the IPD device 1103 to the connectors 1005. The IPD device 1103 may be a semiconductor device or other device that includes a one or more passive devices such as capacitors, resistors, inductors, and the like. The IPD device 1103 may also include metallization layers that are electrically coupled to the passive devices, and the like, therein, as desired for a particular functionality. In some embodiments, the IPD device 1103 may be configured to provide voltage or current stabilization for the first semiconductor device 801. In some embodiments, more than one IPD device 1103 may be connected to the redistribution structure 1001.

Figure 12:
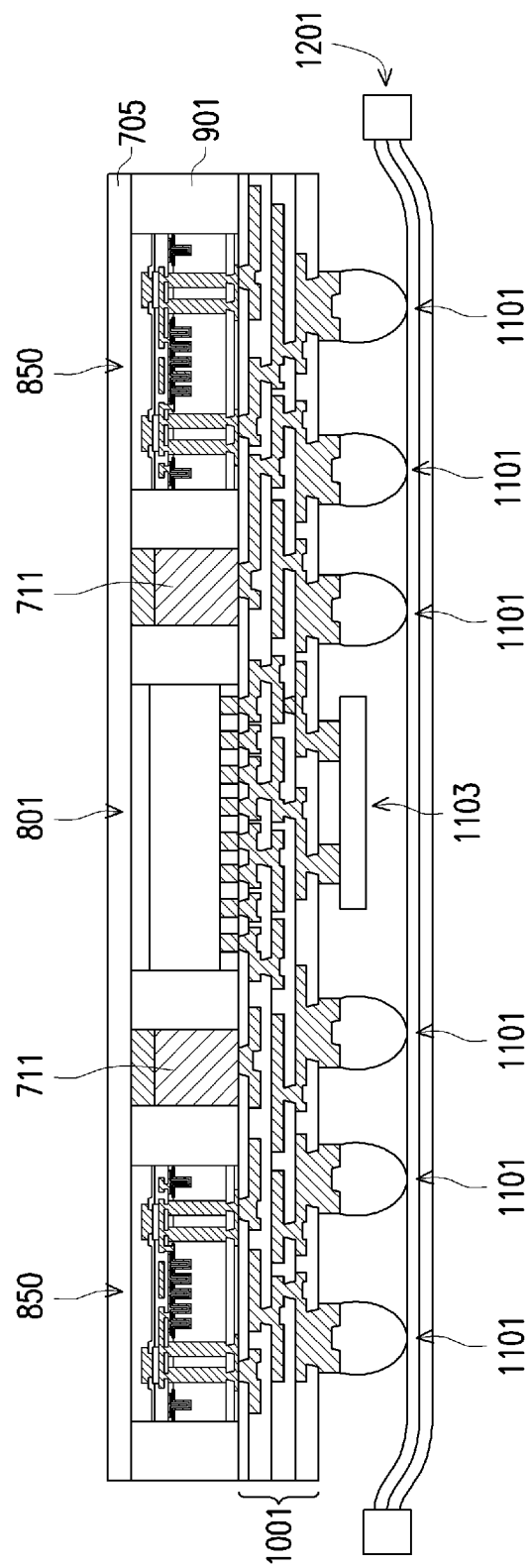

FIG. 12 illustrates a debonding of the carrier substrate 701 and attachment of the resulting structure to a carrier structure 1201. The carrier structure 1201 may be, for example, a metal ring intended to provide support and stability for the structure during and after the debonding process. In an embodiment, the structure is attached to the carrier structure 1201 using, e.g., an ultraviolet tape, although any other suitable adhesive or attachment may alternatively be used. Once the structure is attached to the carrier structure 1201, the carrier substrate 701 and the release layer 703 may be debonded from the structure. In accordance with some embodiments, the debonding includes projecting a light such as a laser light or an UV light on the release layer 703 so that the release layer 703 decomposes under the heat of the light and the carrier substrate 701 can be removed. In some embodiments, the fourth protective layer 705 is left remaining on the structure after debonding, and in other embodiments, the fourth protective layer 705 is removed from the structure after debonding using, e.g., a suitable wet etch or dry etch process.

Figure 13:
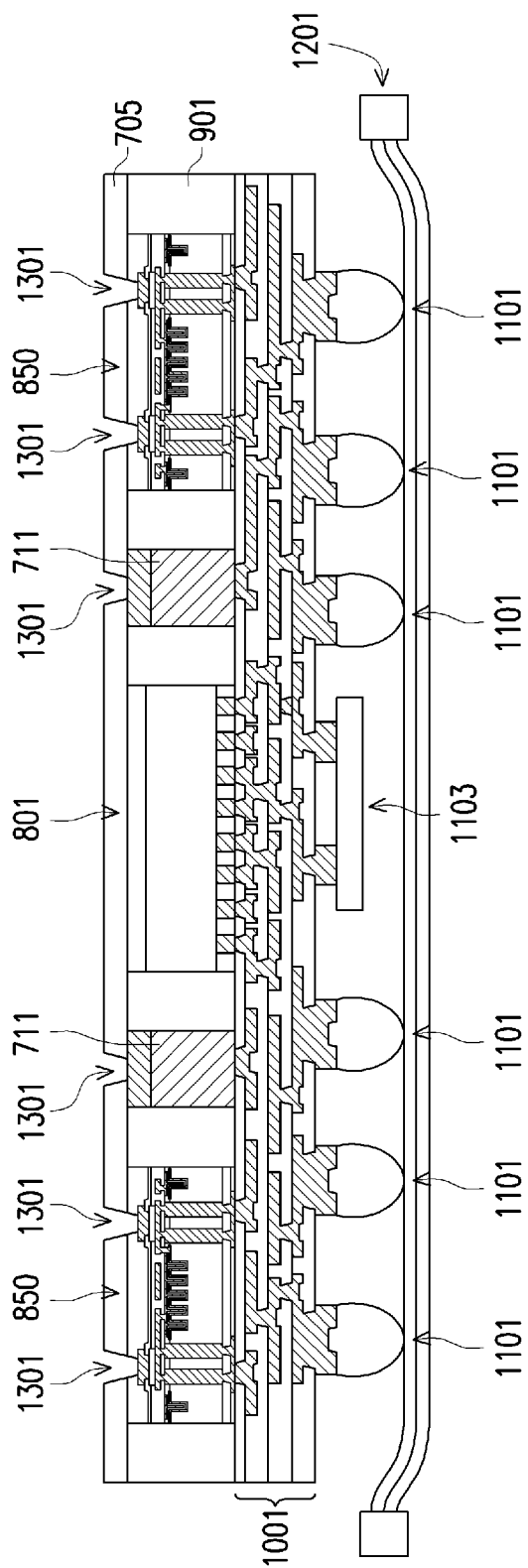

FIG. 13 illustrates a patterning of the fourth protective layer 705 in order to form openings 1301 that expose the vias 711 and the bonding pads (e.g., bonding pads 403) of the interconnect structures 850. In some embodiments, the bonding pads of the interconnect structures 850 are covered by a DAF (e.g., DAF 501 shown in FIG. 6) which is patterned in the same step as the fourth protective layer 705 to expose the bonding pads. In an embodiment, the fourth protective layer 705 (and a DAF, if present) may be patterned using, e.g., a laser drilling method. In some embodiments in which a laser drilling method is used, an optional protective layer such as a light-to-heat conversion (LTHC) layer or a hogomax layer (not separately illustrated in FIG. 13) is first deposited over the fourth protective layer 705. Once protected, a laser is directed towards those portions of the fourth protective layer 705 which are desired to be removed in order to form openings 1301. In some embodiments, the laser drilling process may use a drill angle of about 0 degree (perpendicular to the polymer layer 705) to about 85 degrees to normal of the fourth protective layer 705. In other embodiments, photolithographic techniques may be used to pattern the fourth protective layer 705 (and a DAF, if present). In an embodiment, the patterning may be formed to form openings 1301 having width of between about 50 μm and about 300 μm, such as about 200 μm.

Figure 14:
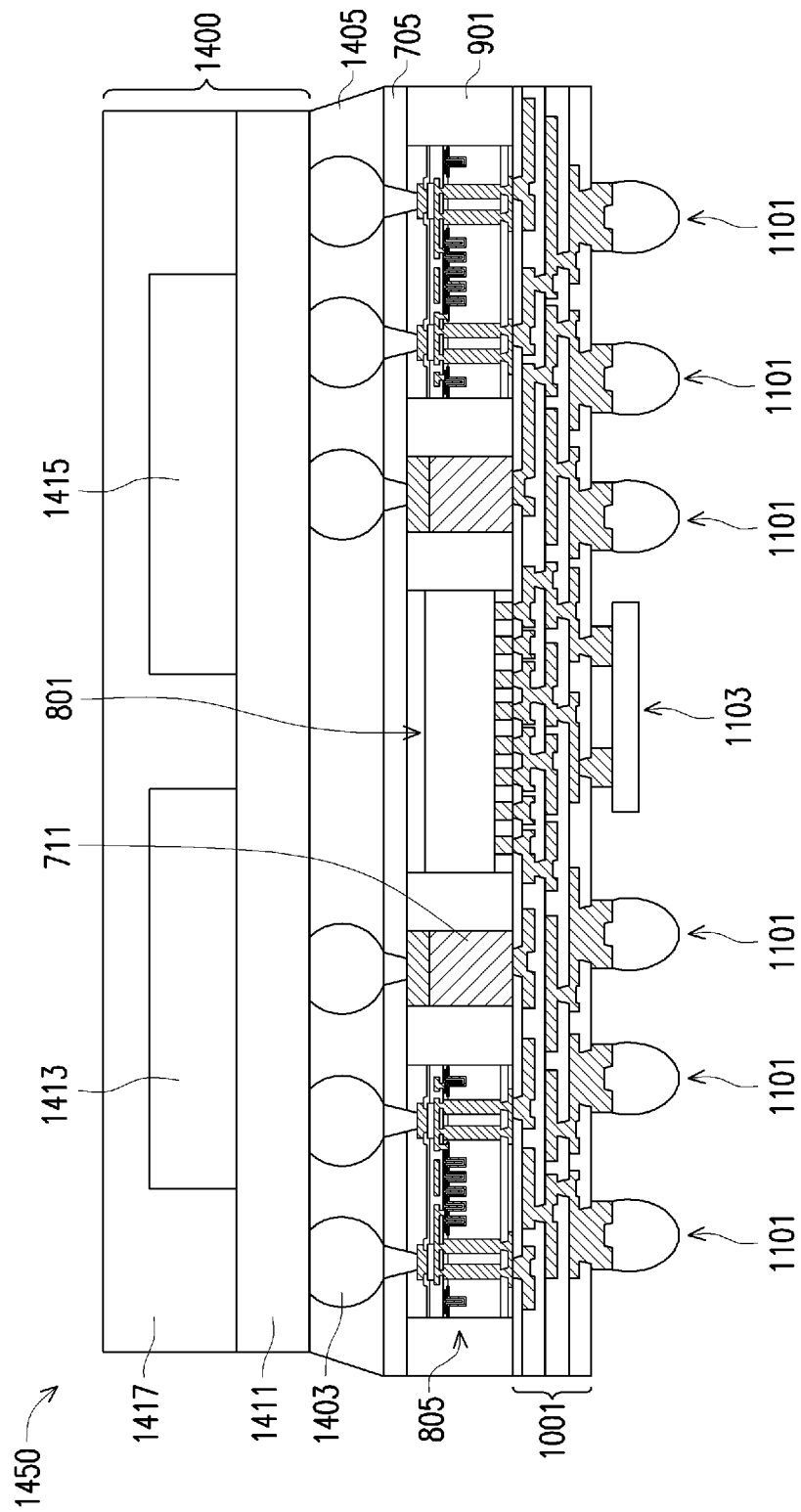

FIG. 14 illustrates the formation of third external connectors 1403 and the attachment of a top package 1400 to form package structure 1450. In an embodiment, the top package 1400 may include a second substrate 1411, a second semiconductor device 1413, a third semiconductor device 1415, and an encapsulant 1417. In an embodiment, the second substrate 1411 may be, e.g., a packaging substrate comprising internal interconnects (e.g., metallization layers, through substrate vias, etc.) to connect the second semiconductor device 1413 and the third semiconductor device 1415 to the interconnect structures 850 and first semiconductor device 801 via the third external connectors 1403.

In some embodiments, the second substrate 1411 may be an interposer used as an intermediate substrate to connect the second semiconductor device 1413 and the third semiconductor device 1415 to the third external connectors 1403. In this embodiment, the second substrate 1411 may be, e.g., a silicon substrate, doped or undoped, or an active layer of a silicon-on-insulator (SOI) substrate. However, the second substrate 1411 may alternatively be a glass substrate, a ceramic substrate, a polymer substrate, or any other substrate that may provide a suitable protection and/or interconnection functionality. These and any other suitable materials may alternatively be used for the second substrate 1411.

The second semiconductor device 1413 or the third semiconductor device 1415 may each be a semiconductor device designed for an intended purpose such as a memory die (e.g., a DRAM die), a logic die, a central processing unit (CPU) die, combinations of these, or the like. In an embodiment, the second semiconductor device 1413 or the third semiconductor device 1415 includes integrated circuit devices, such as transistors, capacitors, inductors, resistors, first metallization layers (not shown), and the like, therein, as desired for a particular functionality. In an embodiment the second semiconductor device 1413 or the third semiconductor device 1415 are designed and manufactured to work in conjunction with or concurrently with each other or with the first semiconductor device 801. While FIG. 14 shows two semiconductor devices 1413 and 1415, in other embodiments more or fewer semiconductor devices may be connected to the second substrate 1411. In some embodiments, the third semiconductor device 1415 is mounted to the second semiconductor device 1413. In some embodiments, the second semiconductor device 1413 or the third semiconductor device 1415 may be electrically connected to the second substrate 1411 using, e.g., wire bonds (not separately illustrated in FIG. 14), although any suitable electrical bonding may be alternatively be utilized. In some embodiments, the second semiconductor device 1413 or the third semiconductor device 1415 may include external connectors (not separately illustrated in FIG. 14) that connect with internal interconnects of the second substrate 1411.

The encapsulant 1417 may be used to encapsulate and protect the second semiconductor device 1413, the third semiconductor device 1415, and the second substrate 1411. The encapsulant 1417 may be a molding compound, a resin such as polyimide, PPS, PEEK, PES, a heat resistant crystal resin, another material, combinations of these, or the like.

In some embodiments, the third external connectors 1403 may be formed over the openings 1301 to provide an external connection to the second substrate 1411. The third external connectors 1403 may be contact bumps such as microbumps or controlled collapse chip connection (C4) bumps and may include a material such as tin, or other suitable materials, such as silver or copper. In an embodiment in which the third external connectors 1403 are tin solder bumps, the third external connectors 1403 may be formed by initially forming a layer of tin through any suitable method such as evaporation, electroplating, printing, solder transfer, ball placement, etc., to a thickness of, e.g., about 100 μm. Once a layer of tin has been formed on the structure, a reflow is performed in order to shape the material into the desired bump shape. In some embodiments, conductive pads are formed within the openings 1301 and over the bonding pads of the interconnect structures 850 and the vias 711. Once the third external connectors 1403 have been formed, the third external connectors 1403 are aligned with the openings 1301, and a bonding process is performed. In an embodiment in which the third external connectors 1403 are solder bumps, the bonding process may include a reflow process such as a thermal process.

FIG. 14 also illustrates the formation of an underfill 1405 between the second substrate 1411 and the fourth protective layer 705 and surrounding the third external connectors 1403. In an embodiment, the underfill 1405 may be a material such as a molding compound, an epoxy, an underfill, a molding underfill (MUF), a resin, or the like. After formation of the underfill 1405, the package structure 1450 may be debonded from the carrier structure 1201. In some embodiments, the package structure 1450 is also singulated from other package structures. In this manner, an individual package structure 1450 may be formed, though other techniques or processes may be used and are considered within the scope of this disclosure. In some embodiments, the package structure 1450 may be an Integrated Fan-out Package-on-Package (InFO-POP) structure.

In some embodiments, the use of one or more interconnect structures 850 may improve electrical performance of a package structure 1450. For example, electrical power may be supplied to the second semiconductor device 1413 or the third semiconductor device 1415 through the TSVs (e.g., TSVs 201) of the interconnect structures 850. For example, a first group of TSVs of an interconnect structure 850 may supply a first voltage or first current, and a second group of TSVs of the interconnect structure may supply a second voltage or second current. In some cases, a supply voltage may be a ground or a common voltage. In some embodiments in which the IPDs (e.g., IPDs 103) of the interconnect structure 850 includes capacitors (e.g., deep-trench capacitors), the capacitors may be connected between the first group of TSVs and the second group of TSVs. Connected in this manner, the capacitors of the interconnect structure 850 may be able decouple the first voltage or first current from the second voltage or second current. In this manner, the interconnect structures 850 can reduce noise, fluctuations, or transients, and stabilize the power supplied to the appropriate semiconductor device (e.g., 1413 or 1415) of the top package 1400. In some embodiments, the interconnect structures 850 may be configured to provide power stabilization to the semiconductor devices of the top package 1400 and the IPD device 1103 may be configured to provide power stabilization to the first semiconductor device 801. In some cases, orienting an interconnect structure 850 such that the IPDs are closer to the semiconductor devices 1413 and 1415 may improve electrical performance of the package structure 1450 more than orienting the IPDs farther from the semiconductor devices 1413 and 1415. In some embodiments, each semiconductor device of the top package 1400 may have an associated interconnect structure 850 that is configured for that device.

FIGS. 15-19C illustrate embodiments of package structures including interconnect structures having IPDs. The package structures 1450, 1452, 1454, 1456, 1458, 1460, and 1462 shown in FIGS. 14-19C are illustrative examples and are not intended to be limiting. For example, different features of the embodiments shown in FIGS. 14-19C may be combined in a single interconnect structure or may be present in different combinations in different interconnect structures within a single package structure.

Figure 15:
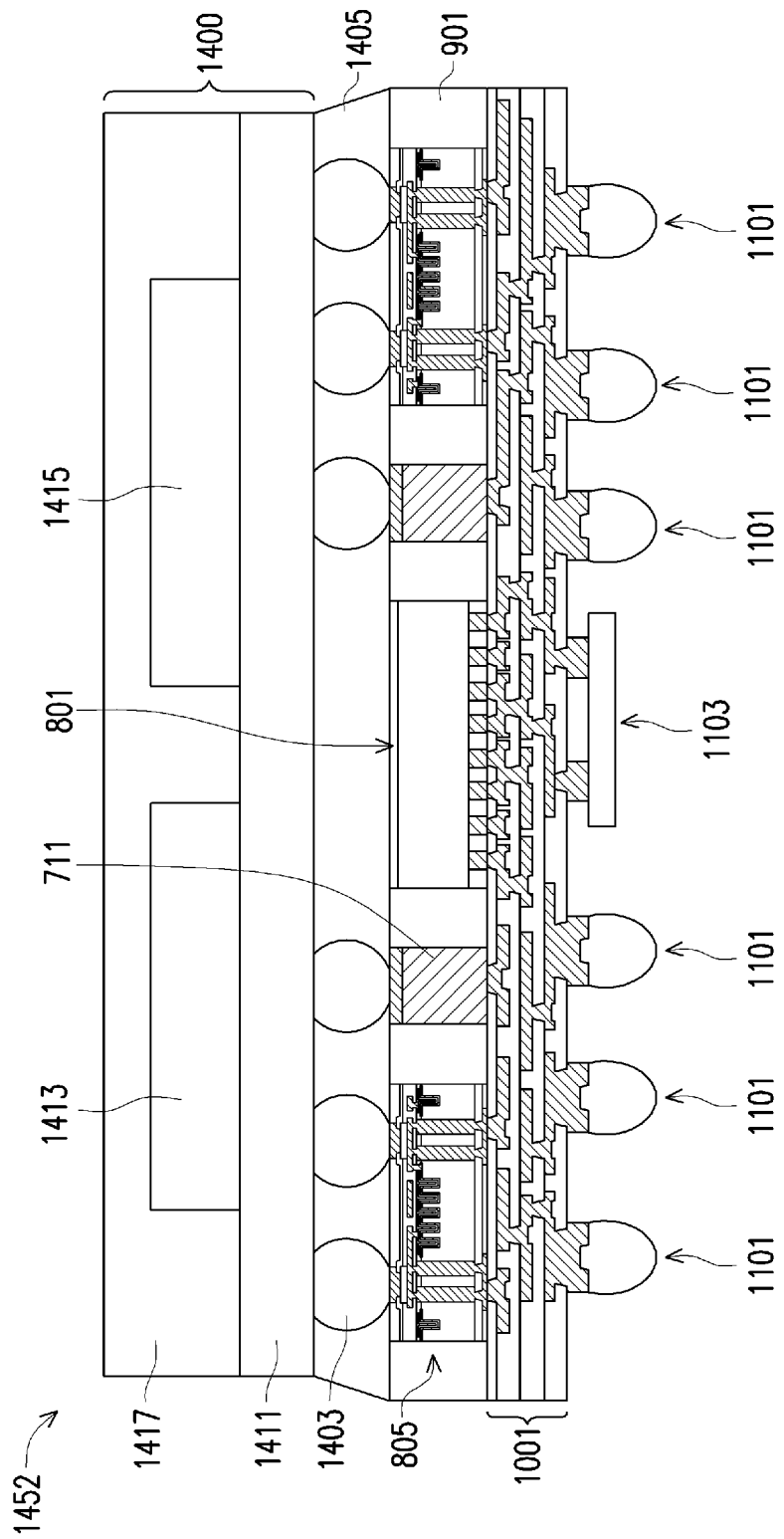
FIG. 15 illustrates a package structure incorporating interconnect structures, in accordance with an embodiment.

FIG. 15 shows a package structure 1452 that includes interconnect structures 850, according to an embodiment. The package structure 1452 is similar to the package structure 1450 described above with respect to FIG. 14, except that the fourth protective layer 705 (see FIG. 12) is removed before attaching the top package 1400. For example, in the process shown in FIGS. 7-14, the fourth protective layer 705 may be removed when the carrier substrate 701 is debonded, described with regard to FIG. 12. In some embodiments, the fourth protective layer 705 may be removed after the carrier substrate 701 has been debonded, such as using a wet etching process or a dry etching process. In some embodiments, the bonding pads (e.g., bonding pads 403) of the interconnect structures 850 and the vias 711 may be exposed after the fourth protective layer 705 is removed. In some embodiments, the bonding pads of the interconnect structures 850 are covered by a DAF (e.g., DAF 501), and openings may be formed in the DAF to expose the bonding pads, which may be in a similar manner as described above with respect to openings 1301 shown in FIG. 13. The removal of the fourth protective layer 705 may be combined with other embodiments shown in FIGS. 16-19C, or with other embodiments not shown. In some cases, removing the fourth protective layer 705 may decrease the overall thickness of the resulting package structure.

Figure 16A:
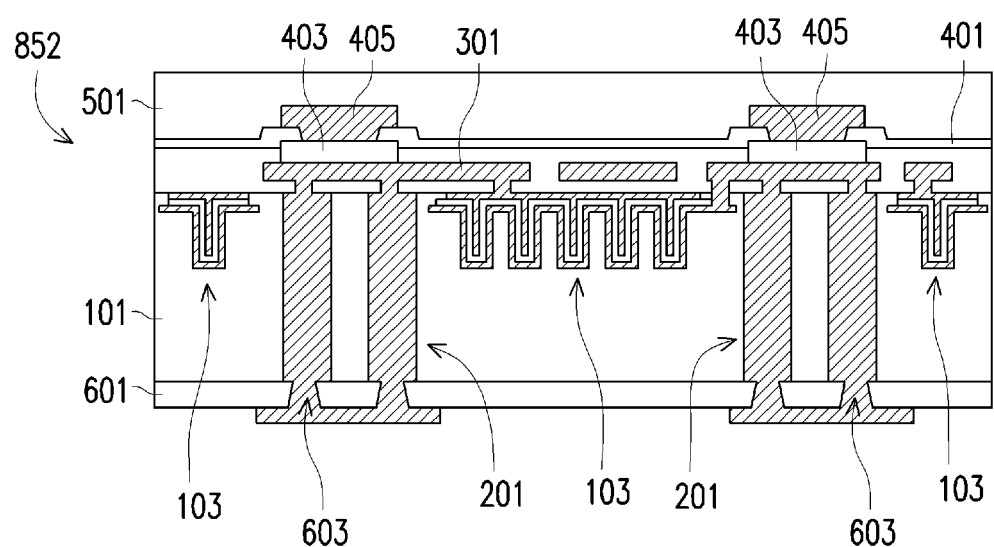
FIGS. 16A-B illustrate an interconnect structure and a package structure incorporating the interconnect structure, in accordance with another embodiment.
Figure 16B:
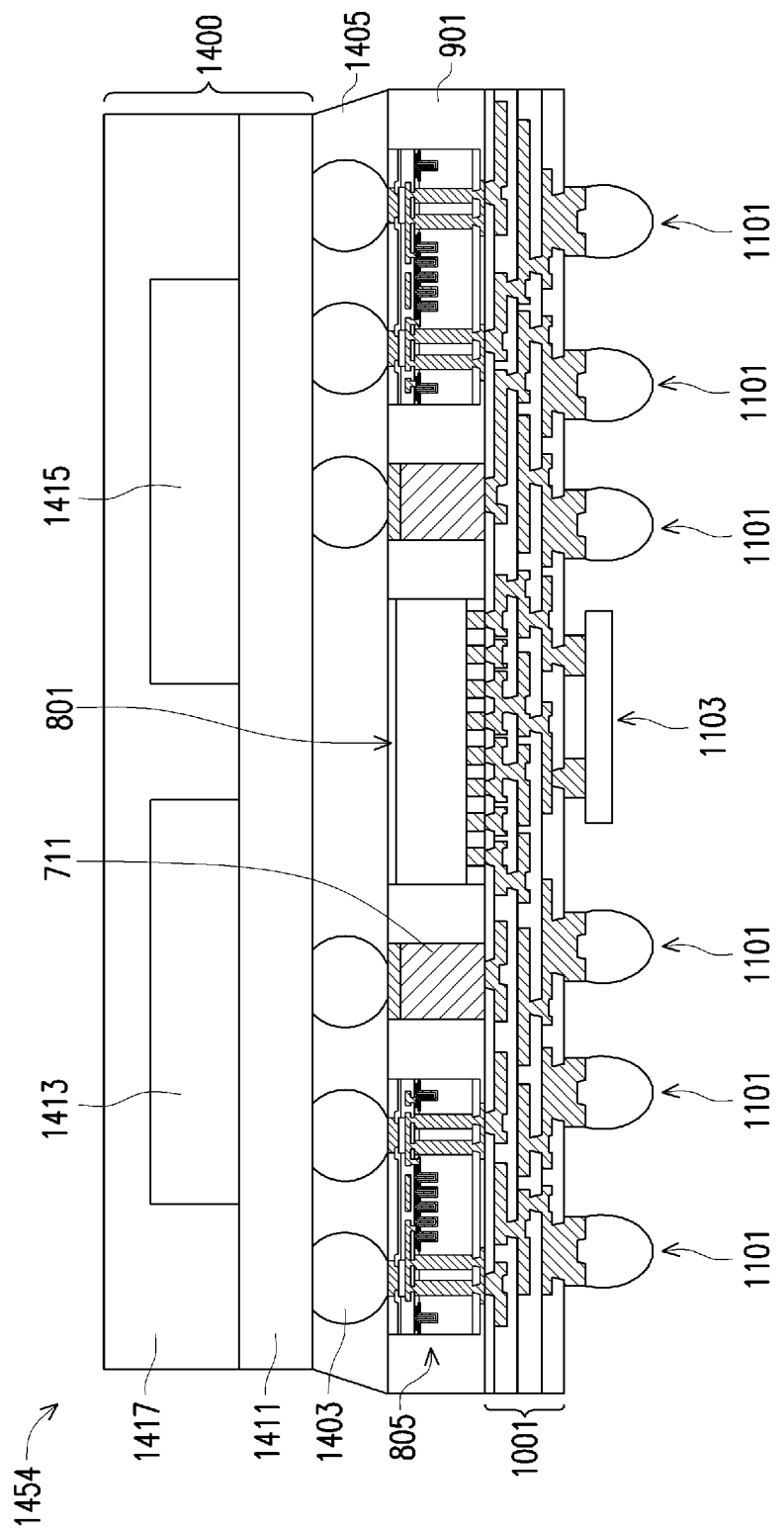

FIGS. 16A-B show an interconnect structure 852 and a package structure 1454 that includes interconnect structures 852, according to an embodiment. The package structure 1454 is similar to the package structure 1452 described above with respect to FIG. 15. For example, the fourth protective layer 705 (see FIG. 12) is removed before attaching the top package 1400. The interconnect structure 852 is similar to the interconnect structure 650 described with respect to FIG. 6, except that the third protective layer 605 (see FIG. 6) is omitted. The redistribution structure 1001 (see FIG. 10) is formed over the second protective layer 601 and the metal contacts 603, and is electrically connected to the metal contacts 603. In some cases, omitting the third protective layer 605 may decrease the cost or time of forming the interconnect structure 852 or the package structure 1454.

Figure 17:
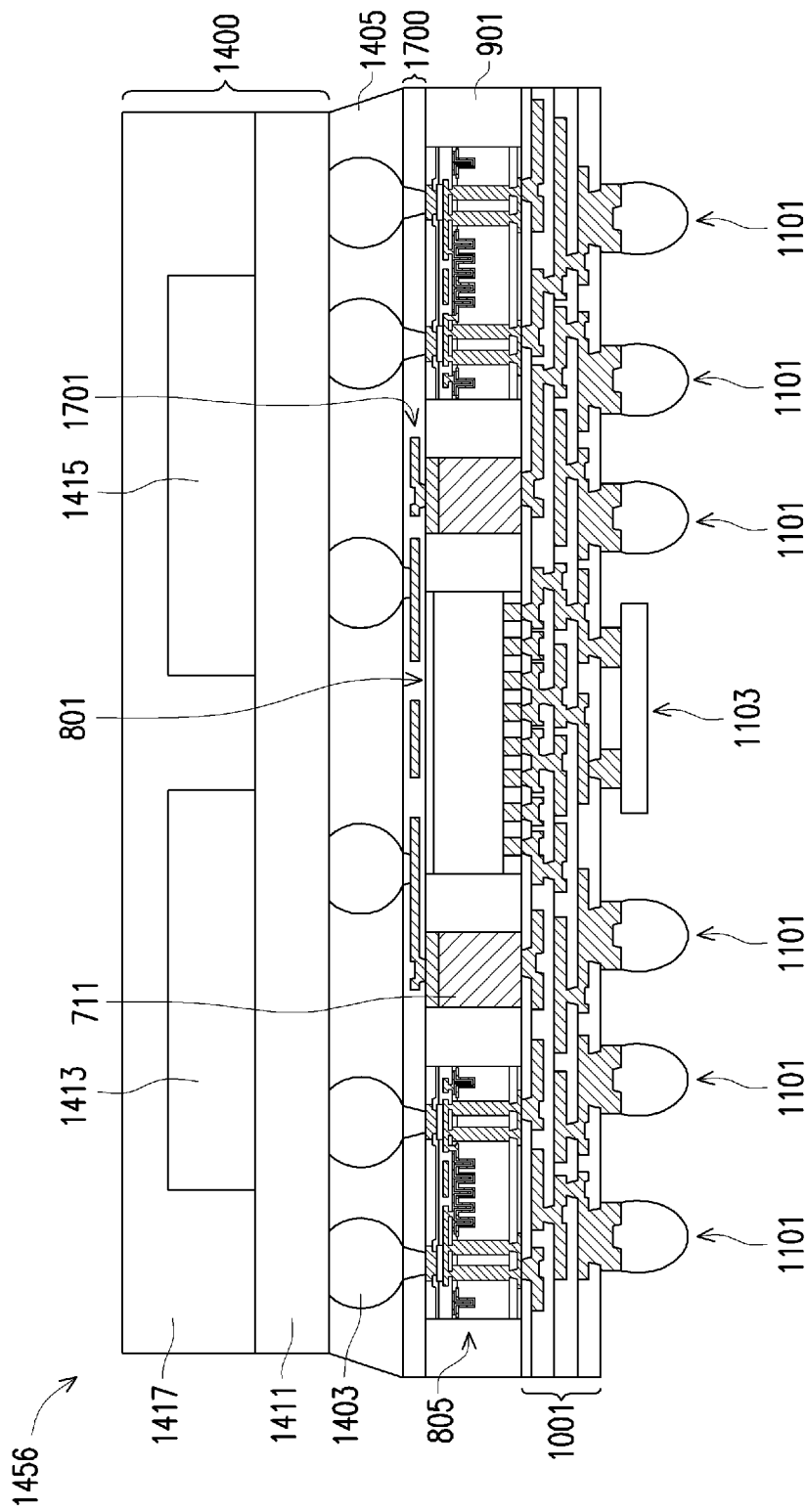
FIG. 17 illustrates a package structure incorporating interconnect structures, in accordance with another embodiment.

FIG. 17 shows a package structure 1456 that includes interconnect structures 850, according to an embodiment. The package structure 1456 is similar to the package structure 1452 described above with respect to FIG. 15, except that a redistribution structure 1700 is disposed between the third external connectors 1403 and the interconnect structures 850, vias 711, and first semiconductor device 801. In some embodiments, the redistribution structure 1700 is formed over the fourth protective layer 705 prior to formation of the photoresist 709 and vias 711, described above with respect to FIG. 7. The redistribution structure 1700 may be formed in a manner similar to that of redistribution structure 1001 (e.g., including multiple insulating layers and multiple conductive layers, described with respect to FIG. 10) or be formed in a different manner. The redistribution structure 1700 may also include more redistribution layers than shown in FIG. 17. In some embodiments, openings are formed through the redistribution structure 1700 and the third external connectors 1403 are connected to the interconnect structures 850 or vias 711 through the openings. For example, FIG. 17 shows the third external connectors 1403 connected to the interconnect structures 850 through the redistribution structure 1700. Openings in the redistribution structure 1700 may be formed by e.g., laser drilling or photolithographic techniques. In some embodiments, laser drilling may expose a portion of a redistribution layer in an opening such that electrical connection is made between a third external connector 1403 formed within the opening and the redistribution layer.

In some embodiments, the third external connectors 1403 are connected to conductive features (e.g., a redistribution layer) within the redistribution structure 1700. For example, FIG. 17 shows the vias 711 and the third external connectors 1403 connected to conductive features within the redistribution structure 1700. The formation of a redistribution structure 1700 may be combined with other embodiments shown in FIG. 14-16-B or 18A-19C, or with other embodiments not shown.

Figure 18A:
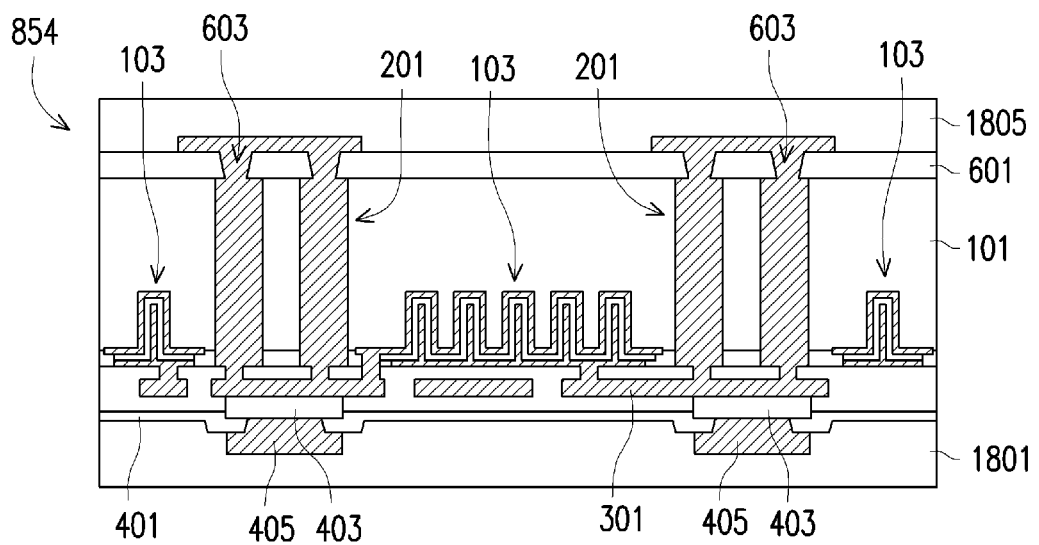
FIGS. 18A-B illustrate an interconnect structure and a package structure incorporating the interconnect structure, in accordance with another embodiment.
Figure 18B:
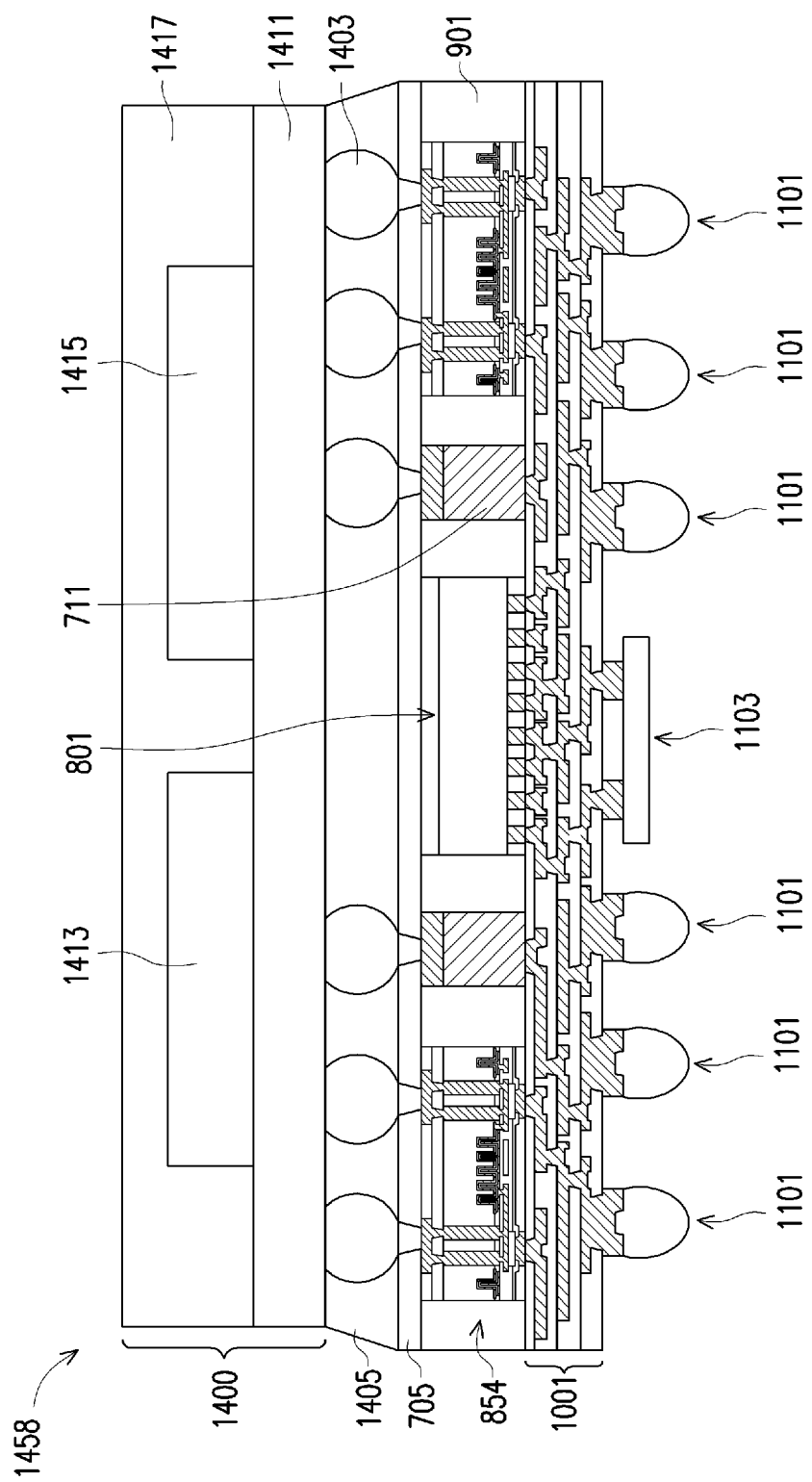

FIGS. 18A-B show an interconnect structure 854 and a package structure 1458 that includes interconnect structures

854, according to an embodiment. The package structure 1458 is similar to the package structure 1450 described above with respect to FIG. 14. The interconnect structure 854 is similar to the interconnect structure 850 described with respect to FIG. 14, except that the interconnect structure 854 is configured to be oriented with the IPDs (e.g., IPDs 103) facing the redistribution structure 1001. In this manner, the third external connectors 1403 may be connected to the metal contacts 603 of an interconnect structure 854. In some embodiments, the interconnect structure 854 includes a top protective layer 1805 disposed over the metal contacts 603, and a bottom protective layer 1801 disposed over the bonding pads 403. The top protective layer 1805 or the bottom protective layer 1801 may be similar to the DAF 501 or similar to the third protective layer 605, described previously with respect to FIGS. 5-6. In some embodiments, the bottom protective layer 1801 may be omitted, similar to the interconnect structure 852 described with respect to FIG. 16A. In some embodiments, the fourth protective layer 705 may be omitted, similar to the package structure 1452 described above with respect to FIG. 15. The different orientation of the interconnect structure 852 may be combined with other embodiments shown in FIG. 14-17 or 19A-C, or with other embodiments not shown.

Figure 19A:
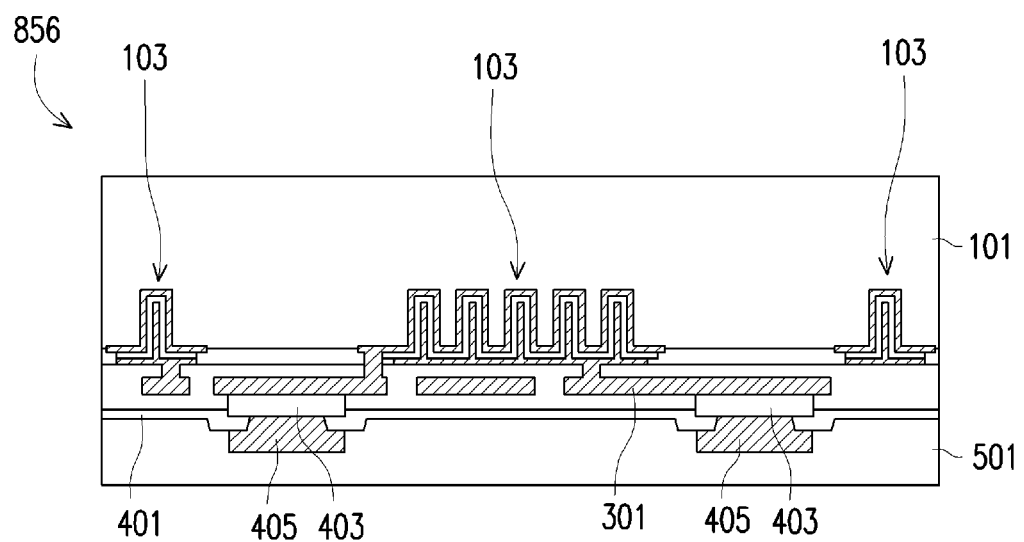
FIGS. 19A-C illustrate an interconnect structure and package structures incorporating the interconnect structure, in accordance with some embodiments.
Figure 19B:
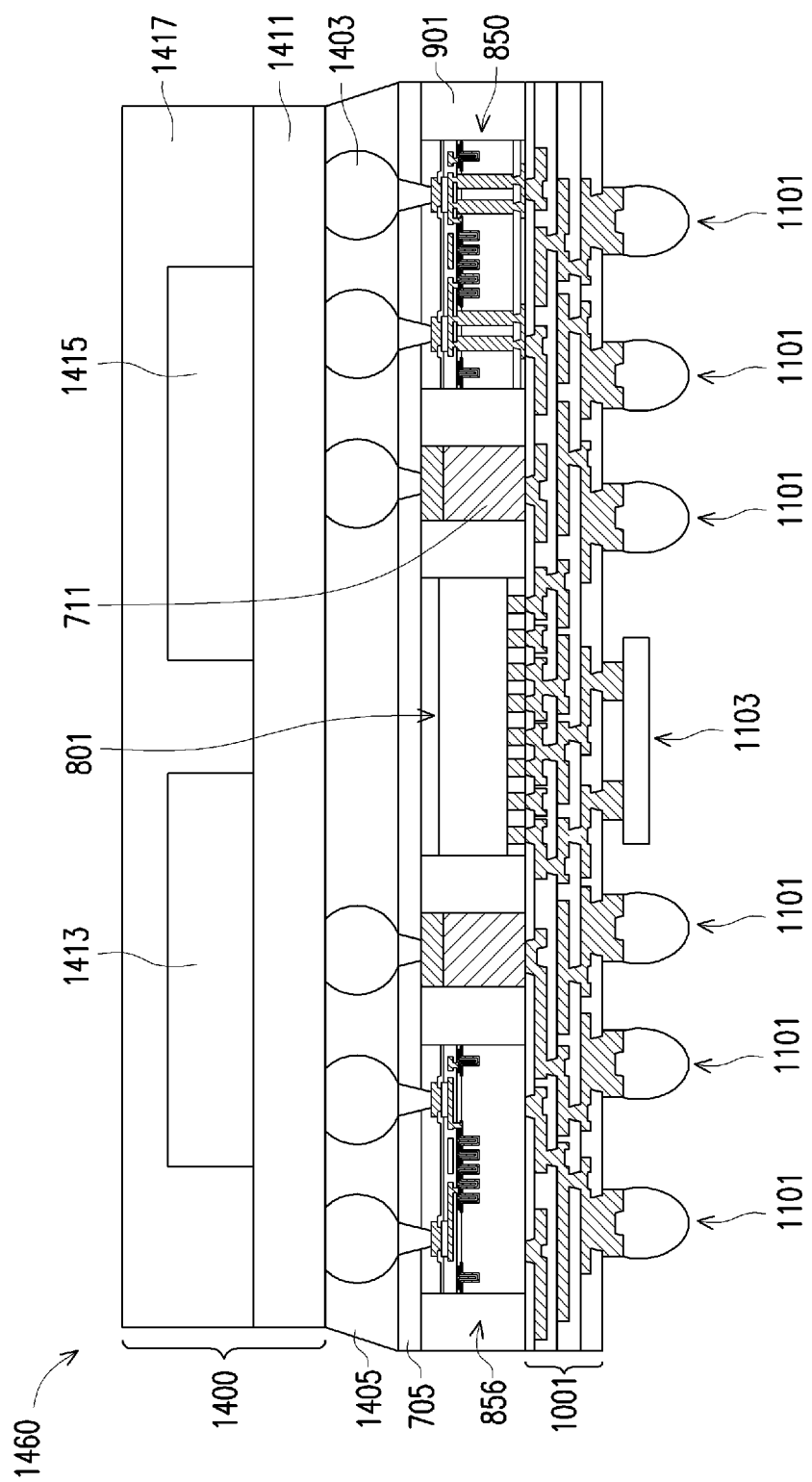
Figure 19C:
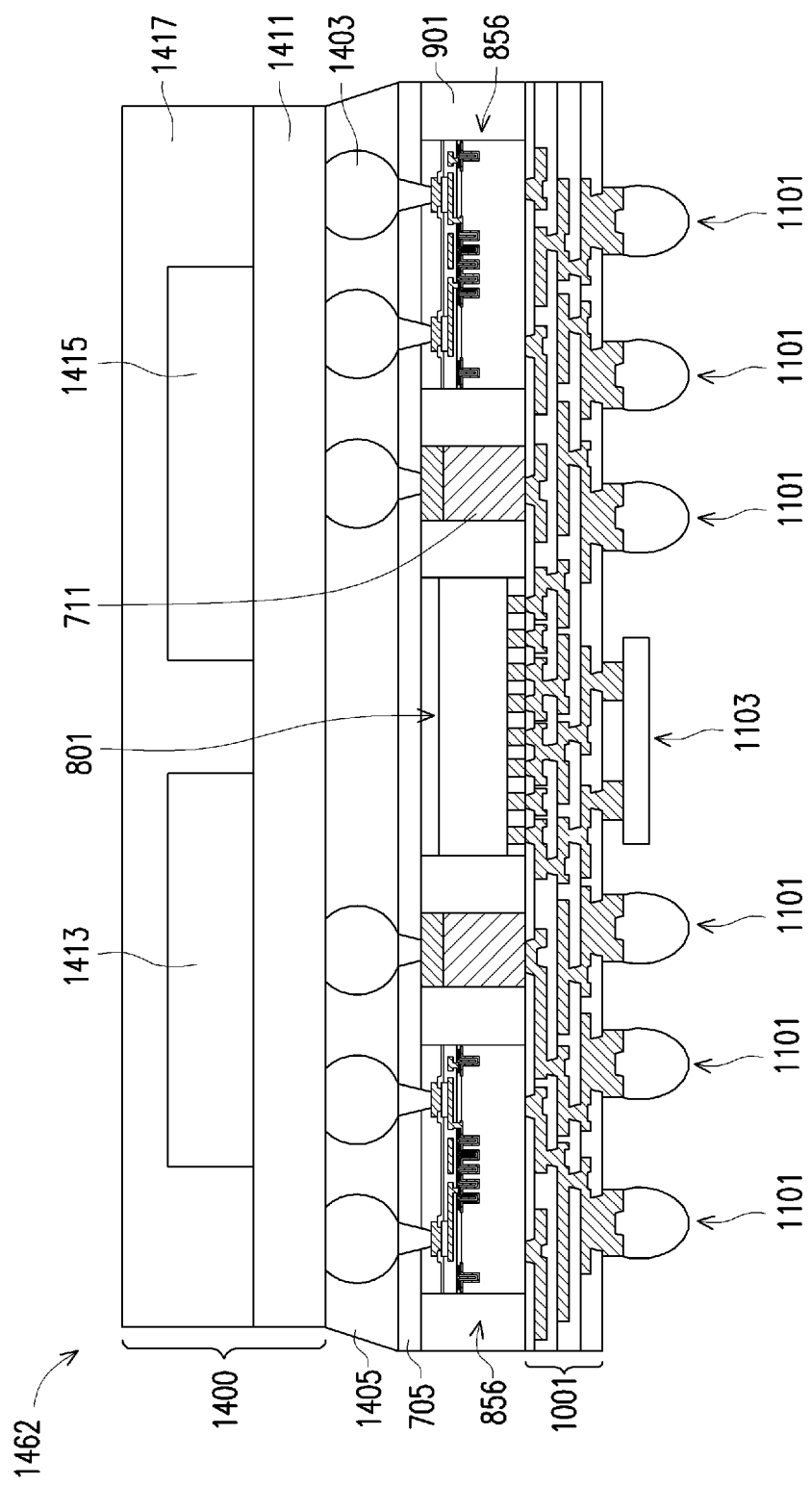

FIG. 19A shows an interconnect structure 856, FIG. 19B shows a package structure 1460 that includes an interconnect structure 856 and an interconnect structure 850, and FIG. 19C shows a package structure 1462 that includes multiple interconnect structures 856, according to some embodiments. The package structure 1460 shown in FIG. 19B is similar to the package structure 1450 described above with respect to FIG. 14, except that the package structure 1460 includes more than one type of interconnect structure. The package structure 1462 shown in FIG. 19C is similar to the package structure 1460 of FIG. 19B, except that all of the interconnect structures within the package structure 1462 are interconnect structures 856. The interconnect structure 856 is similar to the interconnect structure 650 described with respect to FIG. 6, except that the interconnect structure 856 does not include TSVs 201 and associated features, such as metal contacts 603. In this manner, the semiconductor devices of the top package may be connected to the IPDs 103 of the interconnect structure 856 through third external connectors 1403. In some embodiments, the fourth protective layer 705 may be omitted, similar to the package structure 1452 described above with respect to FIG. 15. An interconnect structure without TSVs or a package structure having different types of interconnect structures may be combined with other embodiments shown in FIGS. 14-18B, or with other embodiments not shown.

The interconnect structures described herein may achieve advantages. For example, the interconnect structures may include TSVs that conduct externally provided power to other semiconductor devices within a package, such as memory devices. By incorporating IPDs (e.g., capacitors or other devices) connected to the TSVs within the interconnect structures, the IPDs may provide stabilization or noise reduction for the voltage or current conducted by the TSVs to the semiconductor devices. Additionally, the interconnect structures described herein may reduce equivalent series resistance or equivalent series inductance between the IPDs and the associated semiconductor devices. Device performance may then be improved or be more reliable due to the more stable power, for example, in lower supply voltage applications, higher bandwidth applications, or other applications. In some cases, having the IPDs located closer to the associated semiconductor devices may improve the stabilization provided by the IPDs. Thus, having the interconnect structures disposed within the molding compound (e.g., encapsulant 901) or near the vias (e.g., vias 711) may further improve device performance. Additionally, incorporating the IPDs within a package as described can reduce the size of the package. In this manner, an improved power distribution network for a package may be achieved.

In accordance with an embodiment, a device includes a redistribution structure, a first semiconductor device on the redistribution structure, a top package over the first semiconductor device, the top package including a second semiconductor device, a molding compound interposed between the redistribution structure and the top package, a first set of through vias between and electrically connecting the top package to the redistribution structure, and a first interconnect structure disposed within the molding compound and electrically connecting the top package to the redistribution structure, the first interconnect structure including a substrate and a passive device formed in the substrate, wherein the first interconnect structure is free of active devices. In an embodiment, the passive device includes a trench capacitor. In an embodiment, the first interconnect structure further includes a first through via extending through the substrate, the first through via being electrically connected to the second semiconductor device and a second through via extending through the substrate, the second through via being electrically connected to the second semiconductor device, wherein a first electrode of the passive device is electrically connected to the first through via and a second electrode of the passive device is electrically connected to the second through via. In an embodiment, the first interconnect structure further includes a conductive trace, and the conductive trace electrically connects the passive device and a third through via extending through the substrate. In an embodiment, the device further includes a polymer layer extending over the first interconnect structure, the first set of through vias, and the first semiconductor device. In an embodiment, the first interconnect structure further includes a polymer layer disposed over the passive device, the first through via, and the second through via. In an embodiment, the device further includes a second interconnect structure between the top package and the redistribution structure, the second interconnect structure separated from the first semiconductor device, from the first interconnect structure, and from the first set of through vias by the molding compound. In an embodiment, at least one through via of the first set of through vias is disposed laterally between the first interconnect structure and the first semiconductor device.

In accordance with an embodiment, a device includes a redistribution structure, a package including a first semiconductor device and a second semiconductor device disposed on a package substrate, the package disposed over the redistribution structure, a third semiconductor device disposed between the redistribution structure and the package substrate and electrically connected to the redistribution structure, a via extending between the redistribution structure and the package substrate, the via electrically connecting the redistribution structure to the package substrate, a first passive device structure disposed between the package substrate and the redistribution structure, the first passive device structure including, a first substrate, a first passive device disposed on the first substrate, a first through via extending through the first substrate and electrically connected to the first passive device; and a second through via extending through the first substrate, wherein the first through via and the second through via are electrically connected to the redistribution structure and to the first semiconductor device. The device also includes a second passive device structure disposed between the package substrate and the redistribution structure, the second passive device structure including a second substrate, a second passive device disposed on the second substrate, a third through via extending through the second substrate and electrically connected to the second passive device, and a fourth through via extending through the second substrate, wherein the third through via and the fourth through via are electrically connected to the redistribution structure and to the second semiconductor device, and a molding compound surrounding each of the first passive device structure, the second passive device structure, the via, and the third semiconductor device. In an embodiment, the first through via and the second through via are connected to the same terminal of the first passive device. In an embodiment, the first through via is configured to transmit a supply voltage to the first semiconductor device, and the second through via is configured to transmit an electrical signal to the first semiconductor device. In an embodiment, the first passive device of the first passive device structure is a capacitor. In an embodiment, the device further including an integrated passive device coupled to the redistribution structure opposite the package substrate. In an embodiment, the device further includes at least one redistribution layer disposed between the via and the package substrate.

In accordance with an embodiment, a method of manufacturing a semiconductor device includes forming a set of vias on a carrier substrate, placing a first die on the carrier substrate, the first die being spaced apart from the set of vias, and placing a first interconnect structure on the carrier substrate, the first interconnect structure being spaced apart from the first die and the set of vias. The first interconnect structure includes a substrate, a first conductive element and a second conductive element extending from one side of the substrate to a second side of the substrate, a metallization layer disposed over and electrically connected to the first conductive element and the second conductive element, and an integrated passive device, wherein the integrated passive device is electrically connected to the first conductive element and the second conductive element through the metallization layer. The method also includes encapsulating the set of vias, the first die, and the first interconnect structure in an encapsulant, wherein the encapsulant is in physical contact with the set of vias, the first die, and the first interconnect structure, and placing a top package over the set of vias, the first die, and over a first side of the first interconnect structure, wherein the top package includes a second die, and wherein placing the top package includes electrically connecting a second die to the integrated passive device. In an embodiment, the method further includes forming a redistribution structure over the set of vias, the first die, and over a second side of the first interconnect structure that is opposite the first side of the first interconnect structure. In an embodiment, the method further includes forming a dielectric layer over the set of vias, the first die, and over the first side of the first interconnect structure, forming openings in the dielectric layer, and forming a conductive material within the openings, the conductive material contacting the set of vias and the metallization layer of the first interconnect structure. In an embodiment, forming the openings in the dielectric layer includes using a laser drilling process. In an embodiment, the method further includes placing a second interconnect structure on the carrier substrate. In an embodiment, the integrated passive device is a trench capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a redistribution structure;
a first semiconductor device on the redistribution structure;
a top package over the first semiconductor device, the top package comprising a second semiconductor device;
a molding compound interposed between the redistribution structure and the top package;
a first set of through vias between and electrically connecting the top package to the redistribution structure;
a first interconnect structure disposed within the molding compound and electrically connecting the top package to the redistribution structure, the first interconnect structure comprising a substrate and a passive device formed in the substrate, wherein the substrate is free of active devices, wherein the first interconnect structure is different from the first semiconductor device; and
wherein an integrated passive device coupled to the redistribution structure opposite the top package.

2. The device of claim 1, wherein the passive device comprises a trench capacitor.

3. The device of claim 1, the first interconnect structure further comprising:
a first through via extending through the substrate, the first through via being electrically connected to the second semiconductor device; and
a second through via extending through the substrate, the second through via being electrically connected to the second semiconductor device, wherein a first electrode of the passive device is electrically connected to the first through via and a second electrode of the passive device is electrically connected to the second through via.

4. The device of claim 3, wherein the first interconnect structure further comprises a conductive trace, and wherein the conductive trace electrically connects the passive device and a third through via extending through the substrate.

5. The device of claim 1, further comprising a polymer layer extending over the first interconnect structure, the first set of through vias, and the first semiconductor device.

6. The device of claim 1, wherein the first interconnect structure further comprises a polymer layer disposed over the passive device, the first through via, and the second through via.

7. The device of claim 1, further comprising a second interconnect structure between the top package and the redistribution structure, the second interconnect structure separated from the first semiconductor device, from the first interconnect structure, and from the first set of through vias by the molding compound.

8. The device of claim 1, wherein at least one through via of the first set of through vias is disposed laterally between the first interconnect structure and the first semiconductor device.

9. A device comprising:
a redistribution structure;
a package comprising a first semiconductor device and a second semiconductor device disposed on a package substrate, the package disposed over the redistribution structure;
a third semiconductor device disposed between the redistribution structure and the package substrate and electrically connected to the redistribution structure;
a via extending between the redistribution structure and the package substrate, the via electrically connecting the redistribution structure to the package substrate;
a first passive device structure disposed between the package substrate and the redistribution structure, the first passive device structure comprising:
a first substrate;
a first passive device disposed on the first substrate;
a first through via extending through the first substrate and electrically connected to the first passive device; and
a second through via extending through the first substrate, wherein the first through via and the second through via are electrically connected to the redistribution structure and to the first semiconductor device;
a second passive device structure disposed between the package substrate and the redistribution structure, the second passive device structure comprising:
a second substrate;
a second passive device disposed on the second substrate;
a third through via extending through the second substrate and electrically connected to the second passive device; and
a fourth through via extending through the second substrate, wherein the third through via and the fourth through via are electrically connected to the redistribution structure and to the second semiconductor device;
a molding compound surrounding each of the first passive device structure, the second passive device structure, the via, and the third semiconductor device; and wherein an integrated passive device coupled to the redistribution structure opposite the package substrate.

10. The device of claim 9, wherein the first through via and the second through via are connected to the same terminal of the first passive device.

11. The device of claim 9, wherein the first through via is configured to transmit a supply voltage to the first semiconductor device, and the second through via is configured to transmit an electrical signal to the first semiconductor device.

12. The device of claim 9, wherein the first passive device of the first passive device structure is a capacitor.

13. The device of claim 9, further comprising at least one redistribution layer disposed between the via and the package substrate.

14. A package structure comprising:
a set of vias on and electrically connected to a redistribution structure;
a first die on and electrically connected to the redistribution structure, the first die being spaced apart from the set of vias;
a first interconnect structure on and electrically connected to the redistribution structure, the first interconnect structure being spaced apart from the first die and the set of vias, the first interconnect structure comprising:
a substrate;
a first conductive element and a second conductive element extending from one side of the substrate to a second side of the substrate;
a metallization layer disposed over and electrically connected to the first conductive element and the second conductive element; and
an integrated passive device, wherein the integrated passive device is electrically connected to the first conductive element and the second conductive element through the metallization layer;
an encapsulant covering and in physical contact with the set of vias, the first die, and the first interconnect structure in an encapsulant;
a top package over the set of vias, the first die, and the first interconnect structure, wherein the top package comprises a second die, and wherein the second die is electrically connected to the integrated passive device; and wherein another integrated passive device is coupled to the redistribution structure opposite the top package.

15. The package structure of claim 14, further comprising a second interconnect structure on and electrically connected to the redistribution structure, the second interconnect structure being spaced apart from the first interconnect structure, the first die, and the set of vias.

16. The package structure of claim 14, wherein the integrated passive device comprises a trench capacitor.

17. The package structure of claim 14, wherein the integrated passive device is at a first side of the first interconnect structure that faces the top package.

18. The package structure of claim 14, wherein the top package is separated from the first interconnect structure by an underfill material.

19. The package structure of claim 14, wherein the first interconnect structure is physically free of active devices.

* * * * *